(12) United States Patent
Sakata et al.

(10) Patent No.: US 8,779,994 B2
(45) Date of Patent: Jul. 15, 2014

(54) ANTENNA EVALUATING APPARATUS FOR EVALUATING MULTIPLE WAVE OF RADIO WAVES TRANSMITTED FROM SCATTERER ANTENNAS WITH FUNCTION OF SUBSTANTIALLY SIMULTANEOUS STOP AND START

(75) Inventors: Tsutomu Sakata, Osaka (JP); Atsushi Yamamoto, Kyoto (JP); Satoru Amari, Osaka (JP)

(73) Assignee: Panasonic Corporation, Osaka (JP)

( * ) Notice: Subject to any disclaimer, the term of this patent is extended or adjusted under 35 U.S.C. 154(b) by 675 days.

(21) Appl. No.: 13/054,845

(22) PCT Filed: Mar. 29, 2010

(86) PCT No.: PCT/JP2010/002243
§ 371 (c)(1),
(2), (4) Date: Jan. 19, 2011

(87) PCT Pub. No.: WO2010/122714
PCT Pub. Date: Oct. 28, 2010

(65) Prior Publication Data
US 2011/0128196 A1    Jun. 2, 2011

(30) Foreign Application Priority Data

Apr. 23, 2009  (JP) .................................. 2009-104847

(51) Int. Cl.
*G01R 29/10* (2006.01)
*G01R 29/08* (2006.01)

(52) U.S. Cl.
CPC .................................... *G01R 29/10* (2013.01);
*G01R 29/0871* (2013.01)
USPC ........................................................ 343/703

(58) Field of Classification Search
CPC ... G01R 29/10; G01R 29/0878; G01R 29/105
USPC ........................................................ 343/703
See application file for complete search history.

(56) References Cited

FOREIGN PATENT DOCUMENTS

| JP | 11-186973 | | 7/1999 | |
|---|---|---|---|---|
| JP | 2000-209166 | | 7/2000 | |
| JP | 2000209166 | A * | 7/2000 | ............. G01R 29/08 |
| JP | 2004-125426 | | 4/2004 | |
| JP | 2005-227213 | | 8/2005 | |
| JP | 2005227213 | A * | 8/2005 | ............. G01R 29/10 |
| JP | 2007-127587 | | 5/2007 | |
| JP | 2007127587 | A * | 5/2007 | ............. G01R 29/10 |

OTHER PUBLICATIONS

International Preliminary Report on Patentability issued Dec. 1, 2011 in International (PCT) Application No. PCT/JP2010/002243.

(Continued)

*Primary Examiner* — Dameon E Levi
*Assistant Examiner* — Collin Dawkins
(74) *Attorney, Agent, or Firm* — Wenderoth, Lind & Ponack, L.L.P.

(57) ABSTRACT

A transmitting signal from a signal generator is divided in seven transmitting signals in a divider, and the phase and the amplitude of each of divided transmitting signals are changed in a phase shifter circuit and an attenuator circuit. The respective transmitting signals from the attenuator circuit are radiated from scatterer antennas. A receiver receives a multiple wave of radiated radio waves by using a receiving antenna. A computer substantially simultaneously starts operations of a D/A converter, the signal generator, and the receiver by using a trigger generator circuit.

12 Claims, 19 Drawing Sheets

(56) References Cited

OTHER PUBLICATIONS

Chinese Office Action issued Apr. 17, 2013 in corresponding Chinese Application No. 201080002152.5.
International Search Report issued Jun. 29, 2010 in International (PCT) Application No. PCT/JP2010/002243.
Tsutomu Sakata et al., "Evaluation of Mobile Terminal Antennas Using Spatial Fading Emulator", Matsushita Technical Journal, vol. 52, No. 5, pp. 70-75, Oct. 2006 (along with English Abstract).
Tsutomu Sakata et al., "Channel Capacity Measurements of a MIMO Antenna under a Rayleigh-fading Channel by a Spatial Fading Emulator", Proceedings of the Institute of Electronics, Information and Communication Engineers 2007 Society Conference, B-1-9, Sep. 2007 (along with partial English translation).
Tsutomu Sakata et al., "A Multipath Measurement System with a Variable Power Angular Spectrum for Handset MIMO Antennas", Technical Report of the Institute of Electronics, Information and Communication Engineers, vol. 108, No. 5, pp. 13-18, Apr. 2008 (along with English Abstract).
Tsutomu Sakata et al., "An Evaluation of the MIMO Transmission Characteristics in a Cluster Propagation Environment Using a Spatial Fading Emulator", Technical Report of the Institute of Electronics, Information and Communication Engineers, vol. 108, No. 429, pp. 121-126, Apr. 2009 (along with English Abstract).

\* cited by examiner

ANTENNA EVALUATING APPARATUS FOR EVALUATING MULTIPLE WAVE OF RADIO WAVES TRANSMITTED FROM SCATTERER ANTENNAS WITH FUNCTION OF SUBSTANTIALLY SIMULTANEOUS STOP AND START

TECHNICAL FIELD

The present invention relates to an antenna evaluating apparatus for evaluating a performance of an antenna of a wireless communication apparatus, and to an antenna evaluating method using the antenna evaluating apparatus.

BACKGROUND ART

Conventionally, there has been proposed an antenna evaluating apparatus which has a plurality of transmitting antennas (referred to as scatterer antennas hereinafter) for modeling scatterers. The transmitting antennas are provided on the circumference of a circle at equal spaces, where the circle has a predetermined radius, and the antenna evaluating apparatus generates a spatial multiple wave in the vicinity of the center of installation positions of the scatterer antennas (See Patent Document 1 and the Non-Patent Documents 1 to 4, for example). In such an antenna evaluating apparatus, a transmitting signal generated by a signal generator is divided into transmitting signals of the same number as that of the scatterer antennas, and divided transmitting signals are radiated from corresponding scatterer antennas via respective phase shifters and attenuators. In this case, by adjusting phase shift amounts of the respective phase shifters and the attenuation amounts of the respective attenuators, a desired fading environment such as a Rayleigh fading environment can be generated at the center of the installation positions the respective scatterer antennas. Therefore, by placing a receiving antenna to be evaluated at the center of the installation position of the respective scatterer antennas, the performance of the receiving antenna under the fading environment can be evaluated based on a received signal received by the receiving antenna.

CITATION LIST

Patent Document

Patent Document 1: Japanese patent laid-open publication No. JP-2005-227213A.

Non-Patent Document

Non-Patent Document 1: Tsutomu Sakata, et al., "Evaluation of Mobile Terminal Antennas Using Spatial Fading Emulator", Matsushita Technical Journal, Vol. 52, No. 5, pp. 70-75, October, 2006.
Non-Patent Document 2: Tsutomu Sakata, et al., "Channel Capacity Measurements of a MIMO Antenna under a Rayleigh-fading Channel by a Spatial Fading Emulator", Proceedings of the Institute of Electronics, Information and Communication Engineers 2007 Society Conference, B-1-9, September, 2007.
Non-Patent Document 3: Tsutomu Sakata et al., "A Multipath Measurement System with a Variable Power Angular Spectrum for Handset MIMO Antennas", Technical Report of the Institute of Electronics, Information and Communication Engineers, Vol. 108, No. 5, pp. 13-18, April, 2008.
Non-Patent Document 4: Tsutomu Sakata et al., "An Evaluation of the MIMO Transmission Characteristics in a Cluster Propagation Environment Using a Spatial Fading Emulator", Technical Report of the Institute of Electronics, Information and Communication Engineers, Vol. 108, No. 429, pp. 121-126, April, 2009.

SUMMARY OF INVENTION

Technical Problem

FIG. 19 is a graph showing one example of a received power received by using the prior art antenna evaluating apparatus. Referring to FIG. 19, $f_D$ is a Doppler frequency, and 't' is time. Conventionally, an amplitude and a phase of a received signal were measured within an arbitrary measurement time interval T1, T2 or T3 in a time interval in which a desired fading environment is generated by using the antenna evaluating apparatus. In this case, in order to increase a reproducibility of the fading environment, it was required to set a duration of the measurement time interval sufficiently longer than a time cycle of the variation of the received signal. For example, as shown in FIG. 19, when the duration of the measurement time interval is not set sufficiently longer than the time cycle of the variation of the received signal, statistical properties such as average values of the received signal in the respective measurement time intervals become different from each other even when the durations of the measurement time intervals T1, T2 and T3 are the same as each other. This leads to such a problem that an evaluation accuracy of the receiving antenna becomes lower when the duration of the measurement time interval is shortened.

It is an object of the present invention is to provide an antenna evaluating apparatus and method each capable of solving the above problems and capable of executing evaluation of a receiving antenna in a time shorter than that of the prior art with an accuracy higher than that of the prior art.

Solution to Problem

An antenna evaluating apparatus according to a first invention includes a plurality of N scatterer antennas provided at predetermined positions different from each other, respectively, signal generator means for generating a predetermined transmitting signal, transmitter means, and receiver means. The transmitter means divides the transmitting signal into a plurality of N transmitting signals, changes at least one of a phase and an amplitude of each of divided transmitting signals, and radiates changed transmitting signals as radio waves from the scatterer antennas corresponding to the changed transmitting signals, respectively. The receiver means receives a multiple wave of radiated radio waves by using a receiving antenna to be evaluated and placed substantially at a center of the respective positions. The antenna evaluating apparatus includes controller means for substantially simultaneously starting operations of evaluation means including the signal generator means, the transmitter means and the receiver means, and evaluates a performance of the receiving antenna based on a received multiple wave.

In the above-described antenna evaluating apparatus, the controller means substantially simultaneously stops the operations of the signal generator means and the receiver means excluding the transmitter means.

In addition, the above-described antenna evaluating apparatus includes at least one signal generator means, at least one transmitter means, and at least one receiver means. When evaluating the receiving antenna, the controller means (a) from the at least one signal generator means, selects at least one signal generator means as evaluation means used for an evaluation, (b) from the at least one transmitter means, selects at least one transmitter means as evaluation means used for the evaluation, (c) from the at least one receiver means, selects at least one receiver means as evaluation means used for the evaluation, and substantially simultaneously starts the operations of selected evaluation means.

Further, in the above-described antenna evaluating apparatus, the controller means substantially simultaneously stops the operations of the signal generator means and the receiver means excluding the transmitter means among the selected evaluation means.

Still further, the above-mentioned antenna evaluating apparatus further includes trigger generator means for generating a trigger signal in response to a trigger generation request signal from the controller means, and outputting the trigger signal to the evaluation means. The controller means generates the trigger generation request signal, and outputs the trigger generation request signal to the trigger generator means, and the evaluation means substantially simultaneously starts the respective operations in response to the trigger signal.

In addition, in the above-described antenna evaluating apparatus, the controller means further includes trigger generator means for generating a trigger signal, and outputting the trigger signal to the evaluation means. The evaluation means substantially simultaneously starts the respective operations in response to the trigger signal.

In an antenna evaluating method using an antenna evaluating apparatus according to a second invention, the antenna evaluating apparatus includes a plurality of N scatterer antennas provided at predetermined positions different from each other, respectively, signal generator means for generating a predetermined transmitting signal, transmitter means, and receiver means. The transmitter means divides the transmitting signal into a plurality of N transmitting signals, changes at least one of a phase and an amplitude of each of divided transmitting signals, and radiates changed transmitting signals as radio waves from the scatterer antennas corresponding to the changed transmitting signals, respectively. The receiver means receives a multiple wave of radiated radio waves by using a receiving antenna to be evaluated and placed substantially at a center of the respective positions. The antenna evaluating method includes a control step of substantially simultaneously starting operations of evaluation means including the signal generator means, the transmitter means and the receiver means, and evaluating a performance of the receiving antenna based on a received multiple wave.

In the above-described antenna evaluating method, the control step further includes a step of substantially simultaneously stopping the operations of the signal generator means and the receiver means excluding the transmitter means.

In addition, in the above-described antenna evaluating method, the antenna evaluating apparatus includes at least one signal generator means, at least one transmitter means, and at least one receiver means. When evaluating the receiving antenna, the control step (a) from the at least one signal generator means, selects at least one signal generator means as evaluation means used for an evaluation, (b) from the at least one transmitter means, selects at least one transmitter means as evaluation means used for the evaluation, (c) from the at least one receiver means, selects at least one receiver means as evaluation means used for the evaluation, and substantially simultaneously starts the operations of selected evaluation means.

Further, in the above-described antenna evaluating method, the control step further includes a step of substantially simultaneously stopping the operations of the signal generator means and the receiver means excluding the transmitter means among the selected evaluation means.

Still further, in the above-described antenna evaluating method, the antenna evaluation apparatus further includes trigger generator means for generating a trigger signal in response to a trigger generation request signal, and outputting the trigger signal to the evaluation means. The control step further includes a step of generating the trigger generation request signal, and outputting the trigger generation request signal to the trigger generator means. The evaluation means substantially simultaneously starts the respective operations in response to the trigger signal.

In addition, in the above-described antenna evaluating method, the control step further includes a step of generating a trigger signal, and outputting the trigger signal to the evaluation means. The evaluation means substantially simultaneously starts the respective operations in response to the trigger signal.

Advantageous Effects of Invention

According to the antenna evaluating apparatus and method of the present invention, the operations of the evaluator means including the signal generator means, the transmitter means and the receiver means used for evaluating the performance of a receiving antenna are substantially simultaneously started, and the performance of the receiving antenna is evaluated based on the received multiple wave. Therefore, it is possible to generate a multiple wave with higher reproducibility at the installation position of the receiving antenna, and to execute the evaluation of the receiving antenna in a time shorter than that of the prior art with an accuracy higher than that of the prior art.

DESCRIPTION OF EMBODIMENTS

Figure 1:
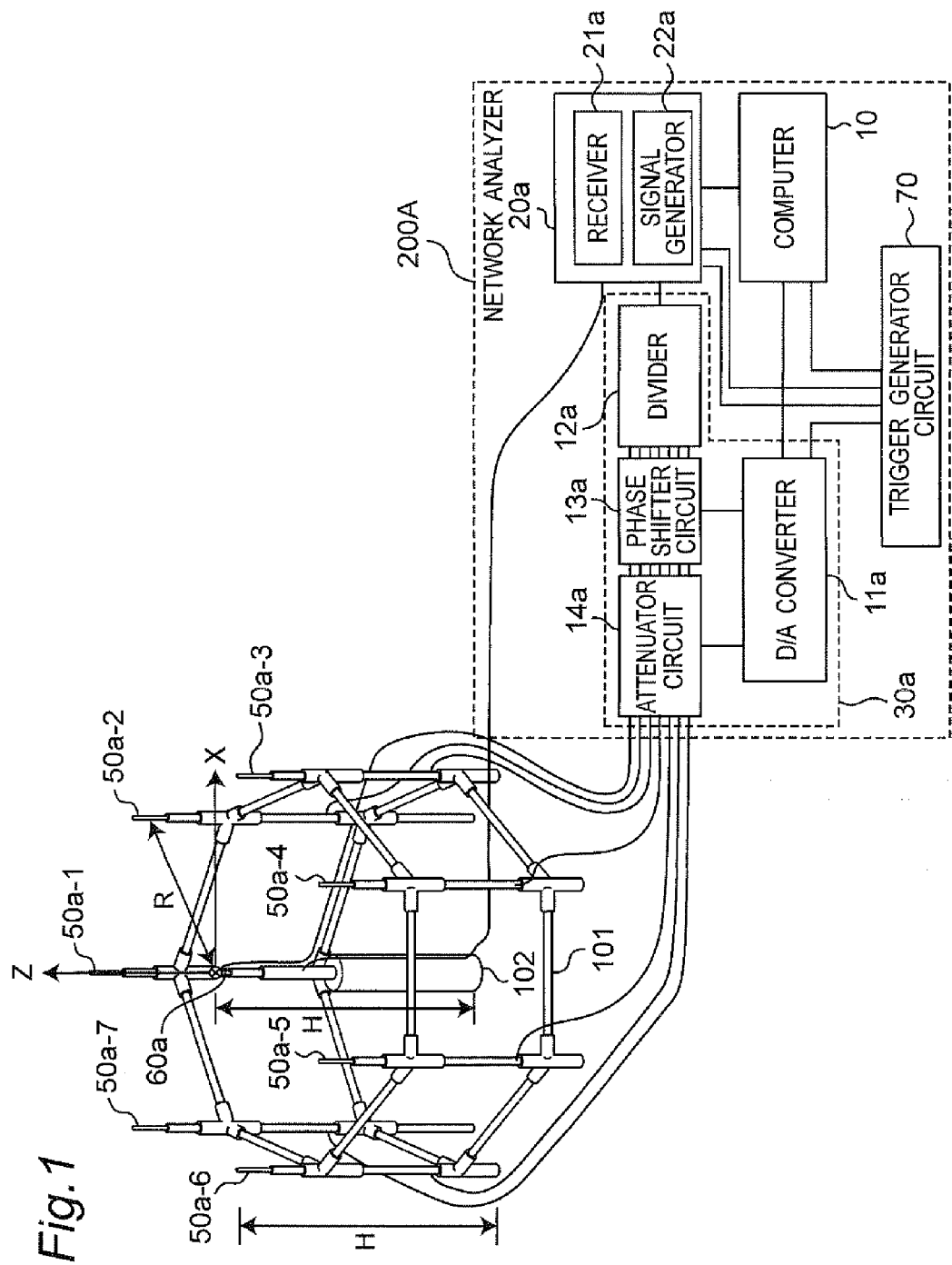
FIG. 1 is a perspective view showing an essential part of a configuration of an antenna evaluating apparatus according to a first preferred embodiment of the present invention.

Preferred embodiments according to the present invention will be described below with reference to the attached drawings. Components similar to each other are denoted by the same reference numerals and will not be described herein in detail.

First Preferred Embodiment

Figure 2:
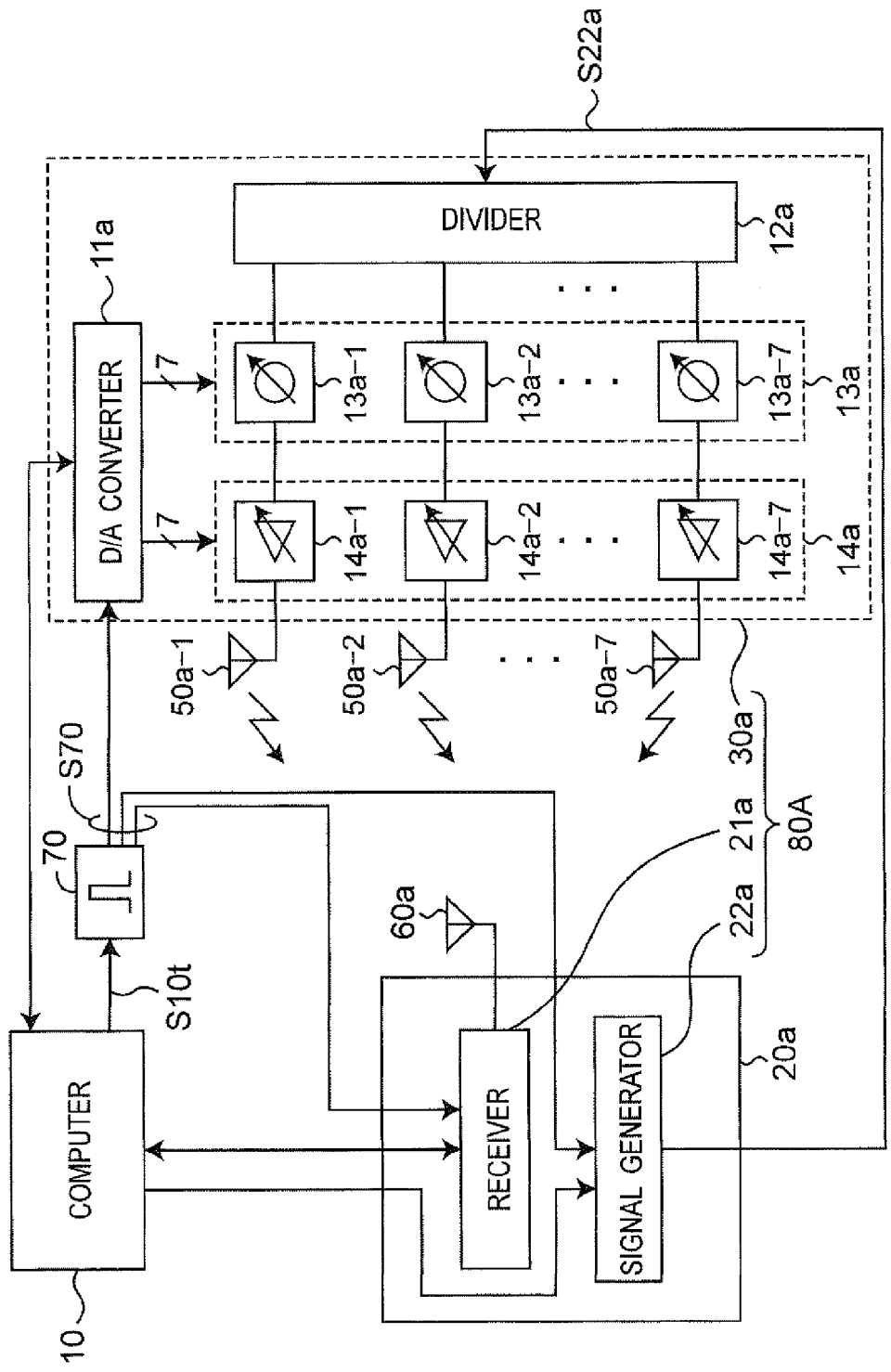
FIG. 2 is a block diagram showing a configuration of a multiple wave controlling and measuring apparatus 200A of FIG. 1.
Figure 3:
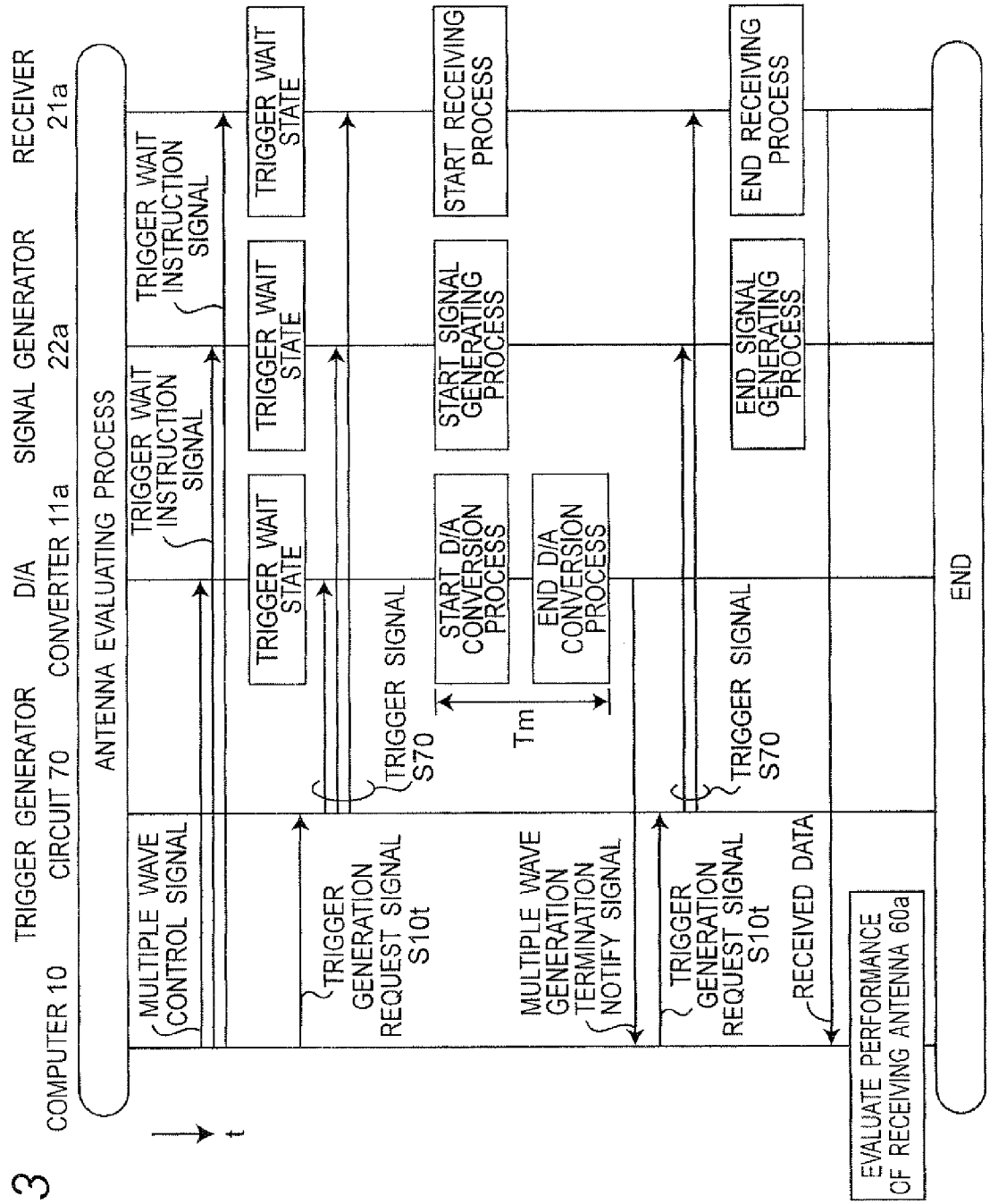
FIG. 3 is a sequence diagram showing an antenna evaluating process executed by the multiple wave controlling and measuring apparatus 200A of FIG. 2.

FIG. 1 is a perspective view showing an essential part of a configuration of an antenna evaluating apparatus (also referred to as a spatial multiple wave generating apparatus or a fading emulator) according to the first preferred embodiment of the present invention, and FIG. 2 is a block diagram showing a configuration of a multiple wave controlling and measuring apparatus 200A of FIG. 1. FIG. 3 is a sequence diagram showing an antenna evaluating process executed by the multiple wave controlling and measuring apparatus 200A of FIG. 2.

As described in detail later, the antenna evaluating apparatus of the present preferred embodiment includes seven scatterer antennas 50a-1 to 50a-7 provided at predetermined positions different from each other, respectively, a signal generator 22a for generating a transmitting signal S22a, a transmitter circuit 30a, and a receiver 21a. The transmitter circuit 30a divides the transmitting signal S22a into seven transmitting signals, changes a phase and an amplitude of each of divided transmitting signals, and radiates changed transmitting signals as radio waves from the respective scatterer antennas 50a-1 to 50a-7 corresponding to the changed transmitting signals, respectively. The receiver 21a receives a multiple wave of radiated radio waves by using a receiving antenna 60a to be evaluated and placed substantially at a center of the installation positions of the scatterer antennas 50a-1 to 50a-7. The antenna evaluating apparatus is characterized by including a computer 10 for substantially simultaneously starting operations of an evaluation circuit 80A, which includes the signal generator 22a, a D/A converter 11a of the transmitter circuit 30a, and the receiver 21a used for evaluating the performance of the receiving antenna 60a, and evaluates the performance of the receiving antenna 60a based on the received multiple wave.

Referring to FIG. 1, the antenna evaluating apparatus of the present preferred embodiment is installed in an anechoic chamber, and configured by including the scatterer antennas 50a-1 to 50a-7, each of which is a half-wave dipole antenna, and the multiple wave controlling and measuring apparatus 200A. In the present preferred embodiment, the receiving antenna 60a to be evaluated is a half-wave dipole antenna that receives vertically polarized radio waves. The scatterer antennas 50a-1 to 50a-7 are vertically installed at positions at vertex portions of a scatterer antenna support base 101 assembled in a frame having a shape of a regular heptagon pillar, so that heights of feeding points of the scatterer antennas 50a-1 to 50a-7 are "H" from the floor surface and vertically polarized radio waves are radiated from the scatterer antennas 50a-1 to 50a-7. With this arrangement, the scatterer antennas 50a-1 to 50a-7 are provided on the circumference of a circle of a radius "R" at equal spaces. In this case, the origin of a right-handed XYZ coordinate system is defined to the center of the positions of the feeding points of the respective scatterer, the positive direction of the Z-axis is defined to an upward direction with respect to the origin, and the positive direction of the Y-axis is defined to a direction directed from the origin toward the scatterer antenna 50a-1. The receiving antenna 60a is vertically installed at a vertex portion of a receiving antenna support base 102 of a pole, so that the feeding point of the receiving antenna 60a positioned at the origin and the vertically polarized radio waves are received by the receiving antenna 60a. In the present preferred embodiment, the scatterer antenna support base 101 and the receiving antenna support base 102 are formed of a resin material such as polypropylene or vinyl chloride. In addition, the height "H" of each of the feeding points of the scatterer antennas 50a-1 to 50a-7 and the receiving antenna 60a measured from the floor surface is set to 1.5 m, and a distance "R" of each of the feeding points measured from the origin is set to 1.5 m.

Referring to FIG. 2, the multiple wave controlling and measuring apparatus 200A is configured by including the computer 10, a network analyzer 20a including the receiver 21a and the signal generator 22a, the transmitter circuit 30a, and a trigger generator circuit 70. Further, the transmitter circuit 30a is configured by including a D/A converter 11a, a divider 12a, a phase shifter circuit 13a, and an attenuator circuit 14a. The phase shifter circuit 13a includes phase shifters 13a-1 to 13a-7 provided for the scatterer antennas 50a-1 to 50a-7, respectively, and the attenuator circuit 14a includes attenuators 14a-1 to 14a-7 provided for the scatterer antennas 50a-1 to 50a-7, respectively. The signal generator 20a, the transmitter circuit 30a and the receiver 21a constitute the evaluation circuit 80A for evaluating the performance of the receiving antenna 60a. In this case, upon receiving a trigger generation request signal S10t from the computer 10, the trigger generator circuit 70 generates a trigger signal S70, and outputs the same signal to at least one of the D/A converter 11a, the signal generator 22a and the receiver 21a. In addition, the network analyzer 20a is set to a single frequency mode in which the signal generator 22a generates a transmitting signal S22a of an unmodulated continuous wave signal having a frequency of 2.14 GHz, a transmission output level is set to +5 dBm, and a screen display is set to a polar coordinate display of a scattering parameter S21. In this case, the network analyzer 20a has an output terminal of a port 1 and an input terminal of a port 2. In addition, the signal generator 22a and the receiver 21a is set so as to start or end signal generating process and receiving process, respectively, in response to an inputted trigger signal S70.

The signal generator 22a starts generating the transmitting signal S22a in response to the trigger signal S70, and outputs the transmitting signal S22a to the divider 12a. The transmitting signal S22a is divided into seven transmitting signals by the divider 12a, and the seven transmitting signals are outputted to the phase shifters 13a-1 to 13a-7, respectively. Each of the phase shifters 13a-1 to 13a-7 shifts the phase of an inputted transmitting signal by a predetermined phase shift amount corresponding to a phase shift amount control voltage from the D/A converter 11a, and outputs a resulting signal to a corresponding one of the attenuators 14a-1 to 14a-7. Each of the attenuators 14a-1 to 14a-7 attenuates an inputted phase-shifted transmitting signals by a predetermined attenuation amount corresponding to an attenuation amount control voltage from the D/A converter 11a, and radiate a resulting signal as a vertically polarized radio wave from a corresponding one of the scatterer antennas 50a-1 to 50a-7 provided for the attenuators 14a-1 to 14a-7, respectively. In this case, since the antenna evaluating apparatus of FIG. 1 is installed in the anechoic chamber, influences of reflected waves reflected on the ceiling, the floor surface, the walls and so on are sufficiently smaller than those of direct waves, and a multiple wave composed of the direct waves radiated from the scatterer antennas 50a-1 to 50a-7 are generated at the installation position of the receiving antenna 60a.

The computer 10 calculates the phase shift amounts of the respective phase shifters 13a-1 to 13a-7 and the attenuation amounts of the respective attenuators 14a-1 to 14a-7, so that the multiple wave in a desired fading environment of such as Rayleigh fading or Nakagami-Rice fading is generated at the installation position of the receiving antenna 60a. Then, the computer 10 generates a digital multiple wave control signal including the phase shift amount control voltages corresponding to calculated phase shift amounts, the attenuation amount control voltages corresponding to calculated attenuation amounts and a measurement time interval Tm, in which the multiple wave is generated, and outputs the digital multiple wave control signal to the D/A converter 11a. In this case, a phase change amount Pn(t) of the radio wave radiated from the n-th (n=1, 2, . . . , N; and N=7 in the present preferred embodiment) scatterer antenna 50a-n is given by the following equation:

$$Pn(t)=2\pi f_D t \cos(\phi n+\phi \text{shift})+\alpha n,\qquad \text{Equation 1:}$$

where, $f_D$ denotes a Doppler frequency, $\phi n$ denotes an azimuth of the scatterer antenna 50a-n when seen from the receiving antenna 60a, $\phi$shift denotes an azimuth of a traveling direction of the receiving antenna 60a, and $\alpha n$ denotes an initial phase. An azimuth $\phi 1$ of the scatterer antenna 50a-1 when seen from the receiving antenna 60a is defined to zero degrees, and the azimuths $\phi n$ and $\phi$shift are measured clockwise with respect to the receiving antenna 60a. In addition, the initial phase $\alpha n$ is determined by using uniform random numbers.

In response to the trigger signal S70, the D/A converter 11a starts a D/A conversion process for converting an inputted multiple wave control signal into the analog phase shift amount control voltages corresponding to the phase shift amounts of the phase shifters 13a-1 to 13a-7, respectively, and the analog attenuation amount control voltages corresponding to the attenuation amounts of the attenuators 14a-1 to 14a-7, respectively. The D/A converter 11a outputs the analog phase shift amount control voltages to the phase shifters 13a-1 to 13a-7, respectively, and outputs the analog attenuation amount control voltages to the attenuators 14a-1 to 14a-7, respectively. In this case, the period of the D/A conversion process is set to a predetermined measurement time interval Tm. It is noted that the start timing of the D/A conversion process by the D/A converter 11a is the start timing of wireless transmission operation by the transmitter circuit 30a. In response to the trigger signal S70, the receiver 21a starts the receiving process for receiving the multiple wave of the radio waves radiated by the scatterer antennas 50a-1 to 50a-7 by using the receiving antenna 60a and measuring the amplitude and the phase of the received signal, and outputs received data including data of measured amplitudes and measured phases to the computer 10. The computer 10 evaluates the performance of the receiving antenna 60a based on the received data from the receiver 21a.

Next, with reference to FIG. 3, the antenna evaluating process executed by the multiple wave controlling and measuring apparatus 200A of FIG. 2 is described. First of all, the computer 10 generates the multiple wave control signal, and outputs the same signal to the D/A converter 11a. In response to this, the D/A converter 11a is put into a trigger wait state. Further, the computer 10 outputs trigger wait instruction signals, each of which represents an instruction to wait for the trigger signal S70, to the signal generator 22a and the receiver 21a. In response to this, the signal generator 22a and the receiver 21a are each put into the trigger wait state. Next, the computer 10 outputs the trigger generation request signal S10t to the trigger generator circuit 70, where the trigger generation request signal S10t represents an instruction to substantially simultaneously output the trigger signal S70 to the D/A converter 11a, the signal generator 22a and the receiver 21a. In response to this, the trigger generator circuit 70 generates the trigger signal S70, and substantially simultaneously outputs the same signal to the D/A converter 11a, the signal generator 22a and the receiver 21a.

In response to the trigger signal S70, the D/A converter 11a starts the D/A conversion process for converting the multiple wave control signal received from the computer 10 into the phase shift amount control voltages for the phase shifters 13a-1 to 13a-7 and attenuation amount control voltages for the attenuators 14a-1 to 14a-7. By this operation, the transmitter circuit 30a starts the wireless transmission operation. Then, the D/A converter 11a stops the D/A conversion process when the measurement time interval Tm has elapsed, and outputs a multiple wave generation termination notify signal to the computer 10, where the multiple wave generation termination notify signal represents a notification that the generation of the multiple wave has been stopped. On the other hand, in response to the trigger signal S70, the signal generator 22a and the receiver 21a start the signal generating process and the receiving process, respectively. In this case, the D/A conversion process, the signal generating process and the receiving process are started substantially simultaneously.

In response to the multiple wave generation termination notify signal, the computer 10 outputs the trigger generation request signal S10t to the trigger generator circuit 70, where the trigger generation request signal S10t represents an instruction to substantially simultaneously output the trigger signal S70 to the signal generator 22a and the receiver 21a. In response to this, the trigger generator circuit 70 generates the trigger signal S70, and substantially simultaneously outputs the same signal to the signal generator 22a and the receiver 21a. In response to this, the signal generator 22a and the receiver 21a substantially simultaneously stop the signal generating process and the receiving process, respectively. Further, the receiver 21a outputs the received data including the data of measured amplitudes and measured phases to the computer 10. The computer 10 evaluates the performance of the receiving antenna 60a based on the received data from the receiver 21a.

As described above in detail, according to the present preferred embodiment, the D/A converter 11a, the signal generator 22a and the receiver 21a substantially simultaneously starts the D/A conversion process, the signal generating process and the receiving process, respectively, in response to the trigger signal S70. Namely, the operation start timings of the signal generator 22a, the transmitter circuit 30a and the receiver 21a constituting the evaluation circuit 80A are substantially synchronized with each other. Therefore, only by setting the initial phases $\alpha n$ of the radio wave transmitted from each scatterer antenna 50a-n in different antenna evaluating processes to be the same as each other, the multiple waves substantially the same as each other can be generated at the installation position of the receiving antenna 60a. Further, since it is possible to generate the multiple waves substantially the same as each other in each antenna evaluating process with higher reproducibility than that of the prior art, the measurement time interval Tm can be made shorter than that of the prior art. Therefore, the receiving antenna 60a can be evaluated in a time shorter than that of the prior art with an accuracy higher than that of the prior art. According to the present preferred embodiment, even when, for example, the receiving antenna 60a is replaced with another receiving antenna, a multiple wave substantially the same as the multiple wave received by the receiving antenna 60a can be received by the another receiving antenna.

In addition, according to the present preferred embodiment, the D/A conversion process, the signal generating process and the receiving process can be automatically started only by outputting the trigger generation request signal S10t to the trigger generator circuit 70 after putting the D/A converter 11a, the signal generator 22a and the receiver 21a into the trigger wait state.

Second Preferred Embodiment

Figure 4:
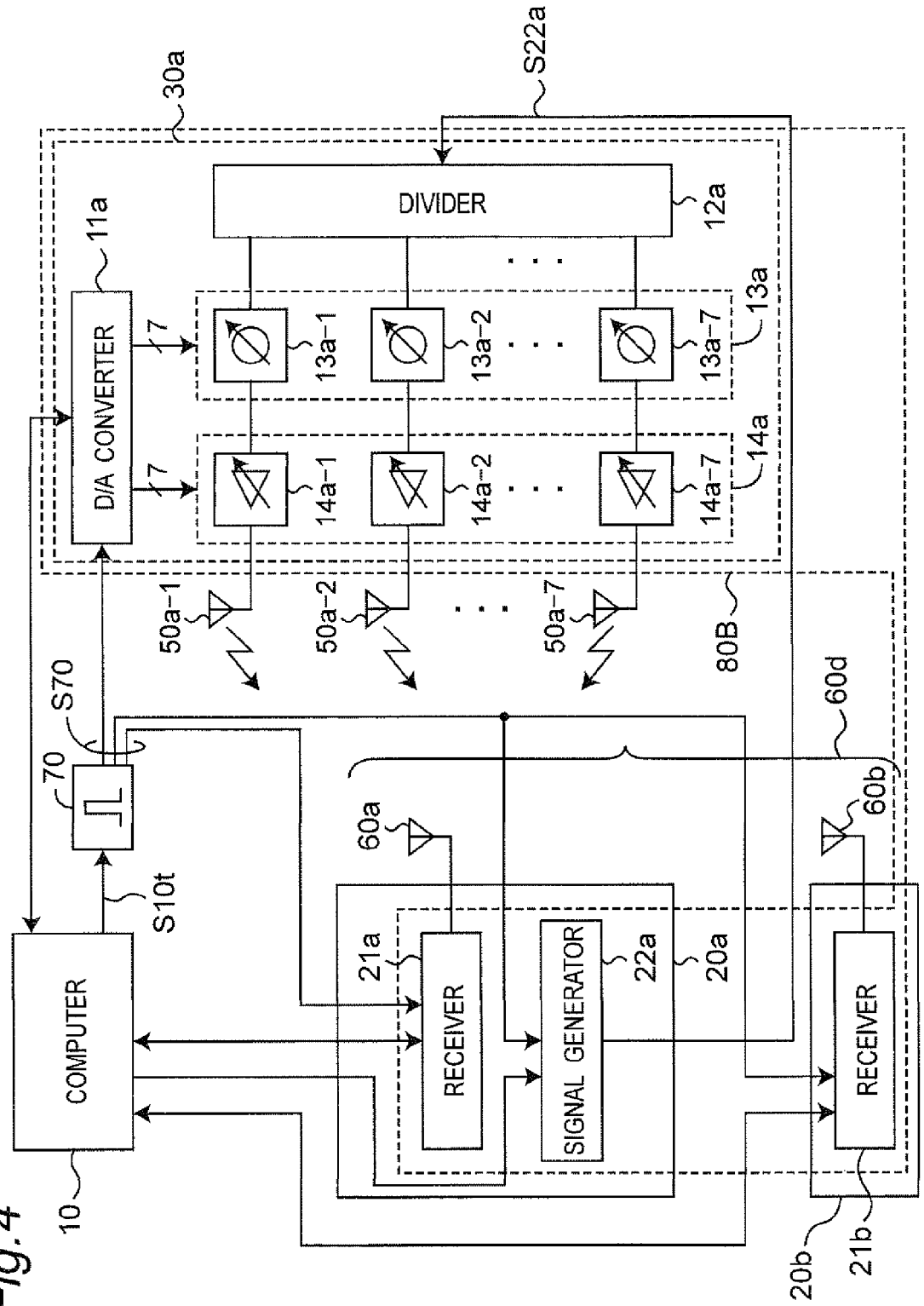
FIG. 4 is a block diagram showing a configuration of a multiple wave controlling and measuring apparatus 200B according to a second preferred embodiment of the present invention.
Figure 5:
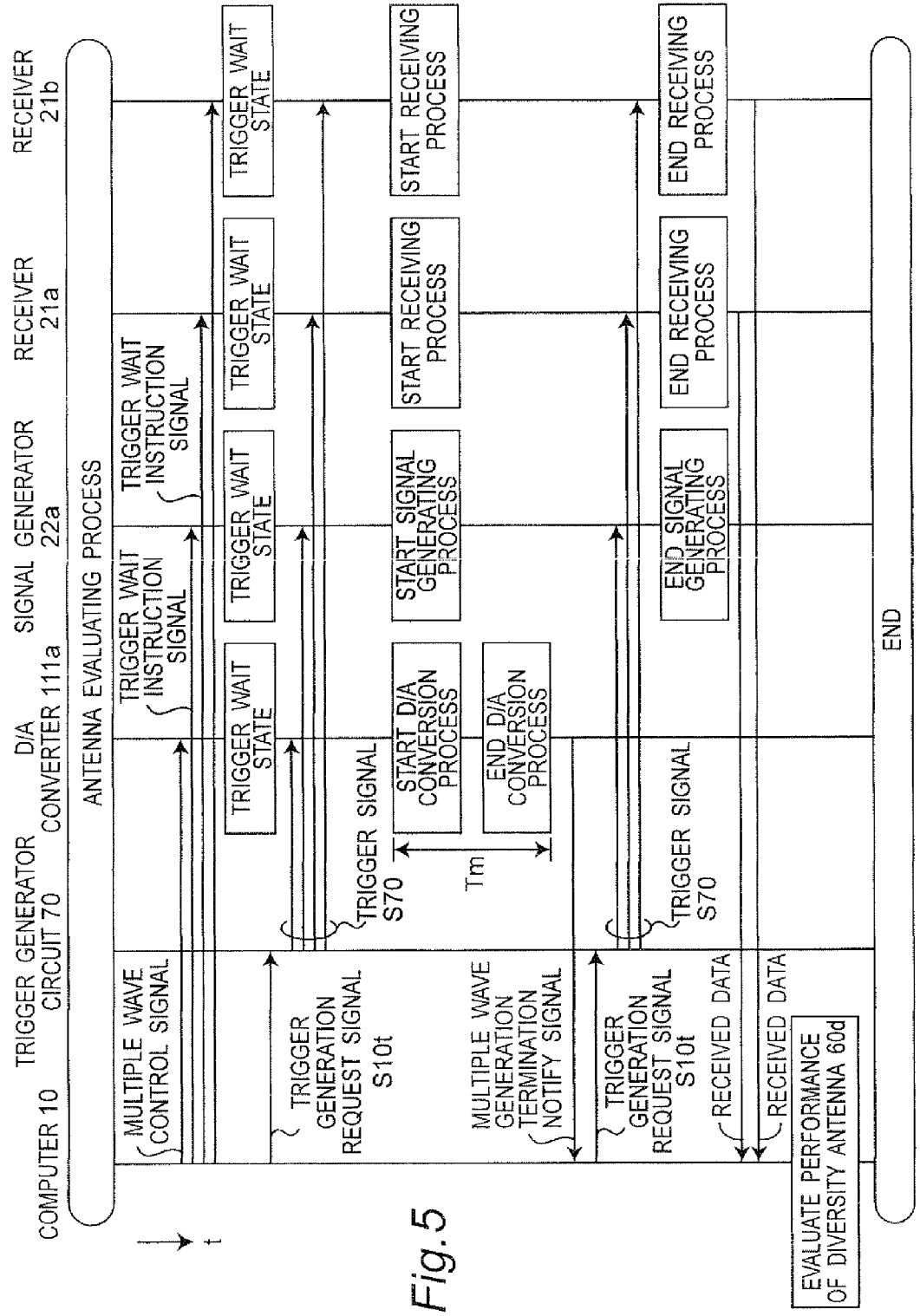
FIG. 5 is a sequence diagram showing an antenna evaluating process executed by the multiple wave controlling and measuring apparatus 200B of FIG. 4.

FIG. 4 is a block diagram showing a configuration of a multiple wave controlling and measuring apparatus 200B according to the second preferred embodiment of the present invention, and FIG. 5 is a sequence diagram showing an antenna evaluating process executed by the multiple wave controlling and measuring apparatus 200B of FIG. 4. The multiple wave controlling and measuring apparatus 200B is characterized by further including a network analyzer 20b including a receiver 21b, as compared with the multiple wave controlling and measuring apparatus 200A of the first preferred embodiment. Further, in the present preferred embodiment, the receiving antenna to be evaluated is a diversity antenna 60d including the receiving antenna 60a and a receiving antenna 60b of a half-wave dipole antenna for receiving vertically polarized radio waves.

The receiving antennas 60a and 60b are vertically provided at the vertex portion of the receiving antenna support base 102 so that the feeding points of the receiving antennas 60a and 60b are positioned at a coordinate position $(0, \lambda/4, 0)$ and a coordinate position $(0, -\lambda/4, 0)$, respectively, in the XYZ coordinate system and vertically polarized radio waves are received by the receiving antennas 60a and 60b. It is noted that $\lambda$ is the wavelength of the radio waves radiated from the scatterer antennas 50a-1 to 50a-7. The receiving antennas 60a and 60b constitute the diversity antenna 60d. In addition, upon receiving the trigger generation request signal S10t from the computer 10, the trigger generator circuit 70 generates the trigger signal S70, and outputs the same signal to at least one of the D/A converter 11a, the signal generator 22a and the receivers 21a and 21b. Further, in the network analyzer 20b, the receiver 21b is set so as to start or end the receiving process is started in response to the inputted trigger signal S70 in a manner similar to that of the receiver 21a. In addition, the receiver 21b receives the multiple wave of the radio waves radiated by the scatterer antennas 50a-1 to 50a-7 by using the receiving antenna 60b, and measures the amplitude and the phase of the received signal in the receiving process. Then, the received data including the data of measured amplitudes and measured phases are outputted to the computer 10. It is noted that the signal generator 20a, the transmitter circuit 30a, the receiver 21a and the receiver 21b constitute an evaluation circuit 80B for evaluating the performance of the diversity antenna 60d.

Next, with reference to FIG. 5, the antenna evaluating process executed by the multiple wave controlling and measuring apparatus 200B of FIG. 4 is described. First of all, the computer 10 generates the multiple wave control signal, and outputs the same signal to the D/A converter 11a. In response to this, the D/A converter 11a is put into the trigger wait state. Further, the computer 10 outputs the trigger wait instruction signals, each of which represents an instruction to wait for the trigger signal S70, to the signal generator 22a and the receivers 21a and 21b. In response to this, the signal generator 22a and the receivers 21a and 21b are each put into the trigger wait state. Next, the computer 10 outputs the trigger generation request signal S10t to the trigger generator circuit 70, where the trigger generation request signal S10t represents an instruction to substantially simultaneously output the trigger signal S70 to the D/A converter 11a, the signal generator 22a and receivers 21a and 21b. In response to this, the trigger generator circuit 70 generates the trigger signal S70, and substantially simultaneously outputs the same signal to the D/A converter 11a, the signal generator 22a and the receivers 21a and 21b.

In response to the trigger signal S70, the D/A converter 11a starts the D/A conversion process for converting the multiple wave control signal received from the computer 10 into the phase shift amount control voltages for the phase shifters 13a-1 to 13a-7 and the attenuation amount control voltages for the attenuators 14a-1 to 14a-7. By this operation, the transmitter circuit 30a starts the wireless transmission operation. Then, the D/A converter 11a stops the D/A conversion process when the measurement time interval Tm has elapsed, and outputs the multiple wave generation termination notify signal to the computer 10, where the multiple wave generation termination notify signal represents a notification that the generation of the multiple wave has been stopped. On the other hand, in response to the trigger signal S70, the signal generator 22a starts the signal generating process. In addition, in response to the trigger signal S70, each of the receivers 21a and 21b starts the receiving process. In this case, the D/A conversion process, the signal generating process and the receiving process by the receivers 21a and 21b are started substantially simultaneously.

In response to the multiple wave generation termination notify signal, the computer 10 outputs the trigger generation request signal S10t to the trigger generator circuit 70, where the trigger generation request signal S10t represents an instruction to substantially simultaneously output the trigger signal S70 to the signal generator 22a and the receivers 21a and 21b. In response to this, the trigger generator circuit 70 generates the trigger signal S70, and substantially simultaneously outputs the same signal to the signal generator 22a and the receivers 21a and 21b. In response to this, the signal generator 22a and the receivers 21a and 21b substantially simultaneously stop the signal generating process and the receiving process, respectively. Further, the receivers 21a and 21b output the received data including the data of the measured amplitudes and measured phases, respectively, to the computer 10. The computer 10 evaluates the performance of the diversity antenna 60d based on the received data from each of the receivers 21a and 21b.

As described above in detail, according to the present preferred embodiment, the D/A converter 11a, the signal generator 22a and the receivers 21a and 21b substantially simultaneously starts the D/A conversion process, the signal generating process and the receiving processes, respectively, in response to the trigger signal S70. Namely, the operation start timings of the signal generator 22a, the transmitter circuit 30a and the receivers 21a and 21b constituting the evaluation circuit 80B are substantially synchronized with each other. Therefore, only by setting the initial phases αn of the radio wave transmitted from each scatterer antenna 50a-n in different antenna evaluating processes to be the same as each other, the multiple waves substantially the same as each other can be generated at the installation position of the diversity antenna 60d. Further, since it is possible to generate the multiple waves substantially the same as each other in each antenna evaluating process with higher reproducibility than that of the prior art, the measurement time interval Tm can be made shorter than that of the prior art. Therefore, the diversity antenna 60d can be evaluated in a time shorter than that of the prior art with an accuracy higher than that of the prior art.

In the present preferred embodiment, the diversity antenna 60d includes the two receiving antennas 60a and 60b, however, the present invention is not limited to this. The diversity antenna 60d may include a plurality of three or more receiving antennas. In this case, it is proper to provide a network analyzer configured in a manner similar to that of the network analyzer 20b for each additional receiving antenna, and to synchronize the receiving process start timings of the network analyzers with each other.

Third Preferred Embodiment

Figure 6:
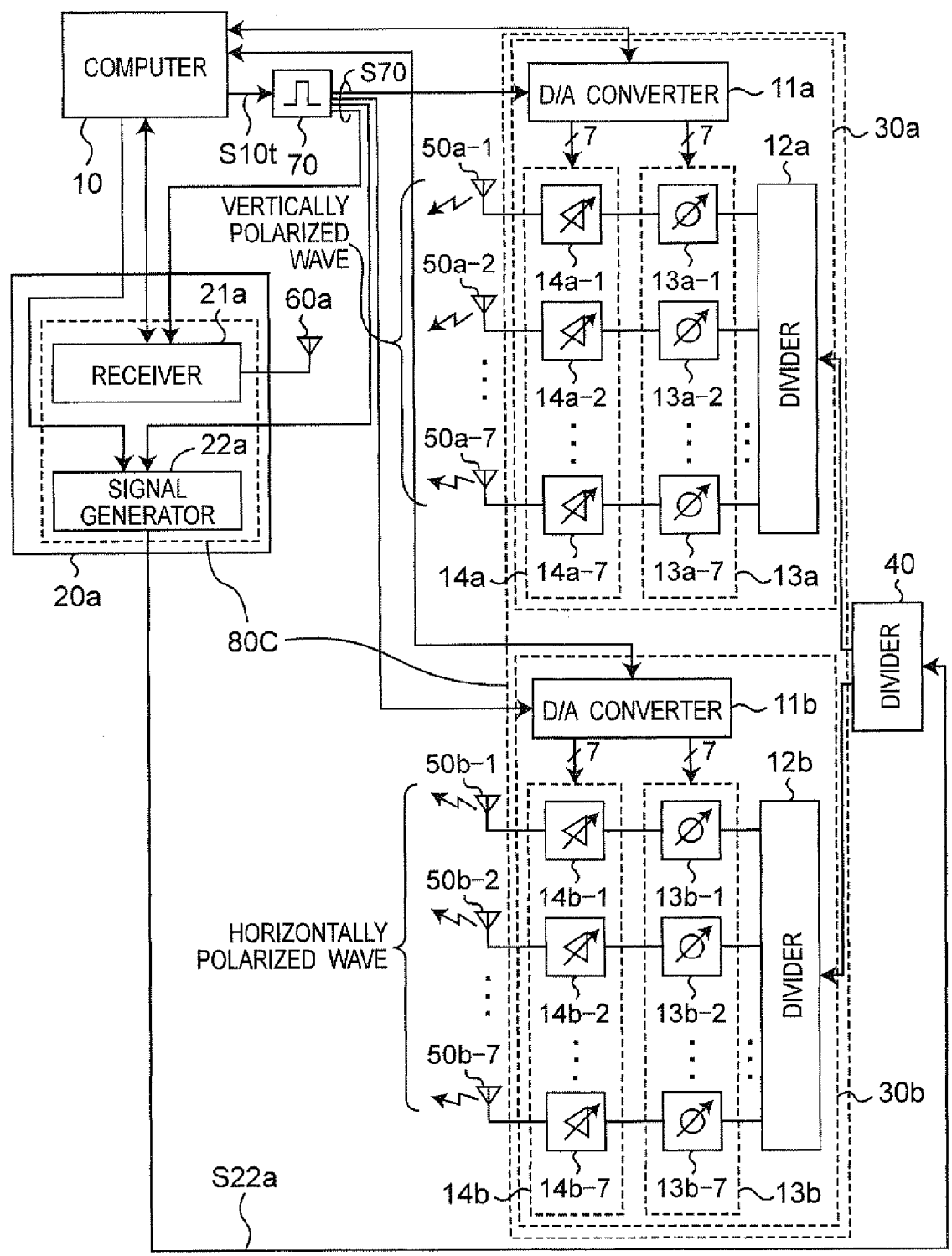
FIG. 6 is a block diagram showing a configuration of a multiple wave controlling and measuring apparatus 200C according to a third preferred embodiment of the present invention.
Figure 7:
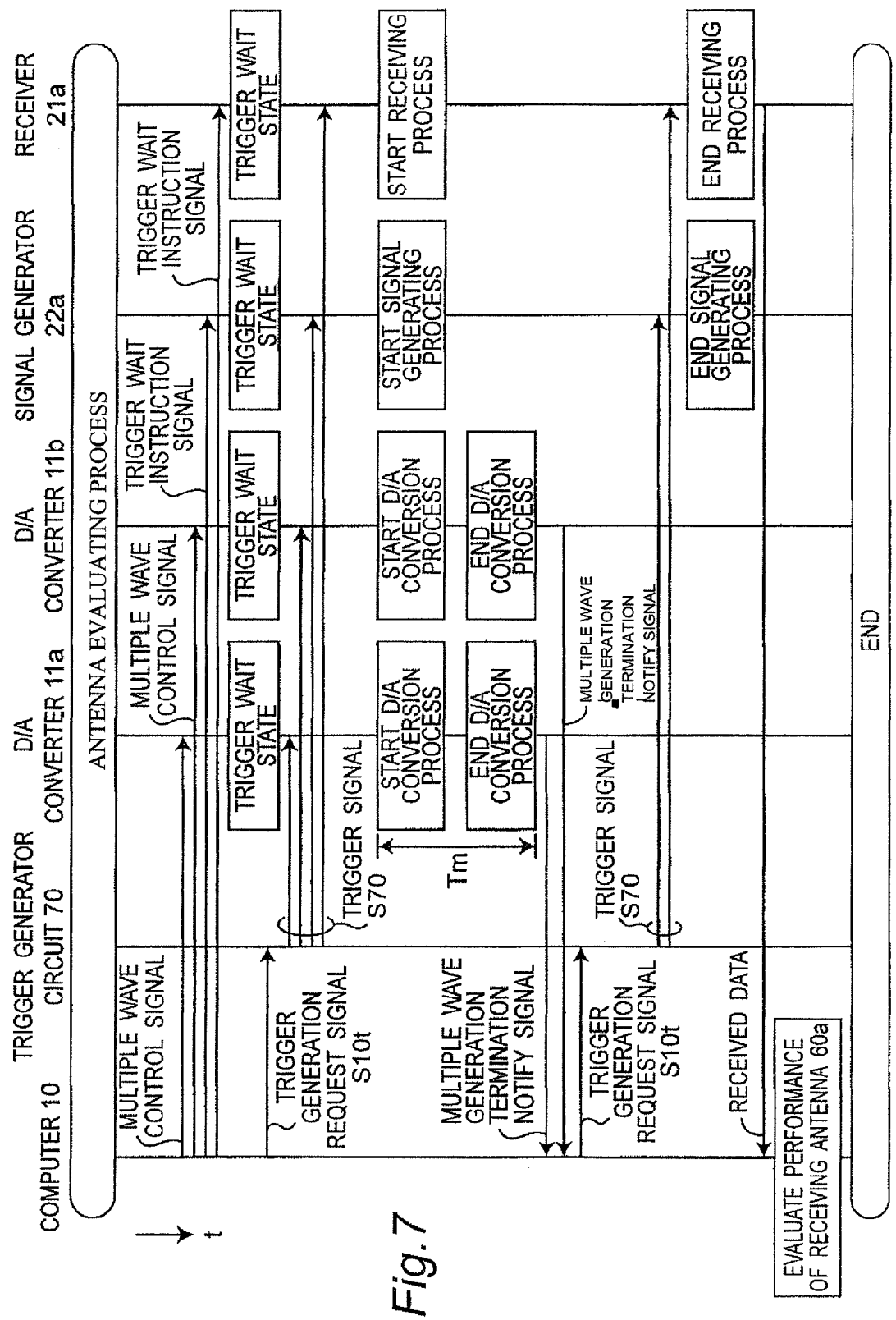
FIG. 7 is a sequence diagram showing an antenna evaluating process executed by the multiple wave controlling and measuring apparatus 200C of FIG. 6.

FIG. 6 is a block diagram showing a configuration of a multiple wave controlling and measuring apparatus 200C according to the third preferred embodiment of the present invention, and FIG. 7 is a sequence diagram showing an antenna evaluating process executed by the multiple wave controlling and measuring apparatus 200C of FIG. 6. The multiple wave controlling and measuring apparatus 200C of the present preferred embodiment is characterized by further including scatterer antennas 50b-1 to 50b-7 that are half-wave dipole antennas, a divider 40 and a transmitter circuit 30b, as compared with the multiple wave controlling and measuring apparatus 200A of the first preferred embodiment. In this case, the transmitter circuit 30b is configured by including a D/A converter 11b, a divider 12b, a phase shifter circuit 13b including phase shifters 13b-1 to 13b-7 provided for the scatterer antennas 50b-1 to 50b-7, respectively, and an attenuator circuit 14b including attenuators 14b-1 to 14b-7 provided for the scatterer antennas 50b-1 to 50b-7, respectively. It is noted that the signal generator 20a, the transmitter circuits 30a and 30b and the receiver 21a constitute an evaluation circuit 80C for evaluating the performance of the receiving antenna 60a.

The scatterer antenna 50b-n is horizontally installed to the scatterer antenna support base 101 so that the feeding point of the scatterer antenna 50b-n is positioned away from the feeding point of the scatterer antenna 50a-n by a distance $\lambda/2$ in a direction from the origin toward the feeding point of the scatterer antenna 50a-n, and so that the scatterer antenna 50b-n radiate a horizontally polarized radio wave. For example, the coordinate positions in the XYZ coordinate system of the feeding points of the scatterer antennas 50a-1 and 50b-1 are (0, R, 0) and (0, R+$\lambda/2$, 0), respectively. It is noted that the longitudinal direction of each scatterer antenna 50b-n is parallel to the tangential line of a circle centered at the origin.

The computer 10 calculates the phase shift amounts of the respective phase shifters 13a-1 to 13a-7 and 13b-1 to 13b-7, and the attenuation amounts of the respective attenuators 14a-1 to 14a-7 and 14b-1 to 14b-7, so that the multiple wave in a desired fading environment of such as Rayleigh fading or Nakagami-Rice fading is generated at the installation position of the receiving antenna 60a. Then, the computer 10 generates digital multiple wave control signal including calculated phase shift amounts, calculated attenuation amounts, and the measurement time interval Tm in which the multiple wave is generated, and outputs the digital multiple wave control signal to the D/A converters 11a and 11b. In this case, the initial phase αn of the vertically polarized radio wave radiated by the scatterer antenna 50a-n is determined based on uniform random numbers different from those for an initial phase βn of the horizontally polarized radio wave radiated by the scatterer antenna 50b-n. In addition, upon receiving the trigger generation request signal S10t from the computer 10, the trigger generator circuit 70 generates the trigger signal S70, and outputs the same signal to at least one of the D/A converters 11a and 11b, the signal generator 22a and the receiver 21a. Further, the divider 40 divides the transmitting signal S22a generated by the signal generator 22a into two transmitting signals, and outputs the two transmitting signals to the dividers 12a and 12b, respectively.

In response to the trigger signal S70, the D/A converter 11b starts a D/A conversion process for converting an inputted multiple wave control signal into analog phase shift amount control voltages corresponding to the phase shift amounts of the phase shifters 13b-1 to 13b-7, respectively. The D/A converter 11b outputs the analog phase shift amount control voltages to the phase shifters 13b-1 to 13b-7, respectively, and outputs the analog attenuation amount control voltages to the attenuators 14b-1 to 14b-7, respectively. In this case, the period of the D/A conversion process is set to the predetermined measurement time interval Tm. It is noted that the start timing of the D/A conversion process by the D/A converter 11b is the start timing of the wireless transmission operation by the transmitter circuit 30b. The transmitting signal S22a from the divider 40 is divided into seven transmitting signals in the divider 12b, and the seven transmitting signals are outputted to the phase shifters 13b-1 to 13b-7, respectively. Each of the phase shifters 13b-1 to 13b-7 shifts the phase of an inputted transmitting signal by a predetermined phase shift amount corresponding to a phase shift amount control voltage from the D/A converter 11b, and outputs a resulting signal to a corresponding one of the attenuators 14b-1 to 14b-7. Each of the attenuators 14b-1 to 14b-7 attenuates an inputted phase-shifted transmitting signals by a predetermined attenuation amount corresponding to an attenuation amount control voltage from the D/A converter 11b, and radiate a resulting signal as a horizontally polarized radio wave from a corresponding one of the scatterer antennas 50b-1 to 50b-7 provided for the attenuators 14b-1 to 14b-7, respectively.

Next, with reference to FIG. 7, the antenna evaluating process executed by the multiple wave controlling and measuring apparatus 200C of FIG. 6 is described. First of all, the computer 10 generates the multiple wave control signals for the D/A converters 11a and 11b, and outputs the same signals to the D/A converters 11a and 11b, respectively. In response to this, the D/A converters 11a and 11b are put into the trigger wait state. Further, the computer 10 outputs the trigger wait instruction signal, each of which represents an instruction to wait for the trigger signal S70, to the signal generator 22a and the receiver 21a. In response to this, the signal generator 22a and the receiver 21a are each put into the trigger wait state. Next, the computer 10 outputs the trigger generation request signal S10t to the trigger generator circuit 70, where the trigger generation request signal S10t represents an instruction to substantially simultaneously output the trigger signal S70 to the D/A converters 11a and 11b, the signal generator 22a and the receiver 21a. In response to this, the trigger generator circuit 70 generates the trigger signal S70, and substantially simultaneously outputs the same signal to the D/A converters 11a and 11b, the signal generator 22a and the receiver 21a.

In response to the trigger signal S70, the D/A converter 11a starts the D/A conversion process for converting the multiple wave control signal received from the computer 10 into the phase shift amount control voltages for the phase shifters 13a-1 to 13a-7 and the attenuation amount control voltages for the attenuators 14a-1 to 14a-7. By this operation, the transmitter circuit 30a starts the wireless transmission operation. Then, the D/A converter 11a stops the D/A conversion process when the measurement time interval Tm has elapsed, and outputs the multiple wave generation termination notify signal to the computer 10, where the multiple wave generation termination notify signal represents a notification that the generation of the multiple wave has been stopped. In addition, in response to the trigger signal S70, the D/A converter 11b starts the D/A conversion process for converting the multiple wave control signal received from the computer 10 into the phase shift amount control voltages for the phase shifters 13b-1 to 13b-7 and the attenuation amount control voltages for the attenuators 14b-1 to 14b-7. By this operation, the transmitter circuit 30b starts wireless transmission operation. Then, the D/A converter 11b stops the D/A conversion process when the measurement time interval Tm has elapsed, and outputs a multiple wave generation termination notify signal to the computer 10, where the multiple wave generation termination notify signal represents a notification that the generation of the multiple wave has been stopped. On the other hand, in response to the trigger signal S70, the signal generator 22a and the receiver 21a start the signal generating process and the receiving process, respectively. In this case, the D/A conversion processes by the D/A converters 11a and 11b, the signal generating process and the receiving process are substantially simultaneously started.

Upon receiving the multiple wave generation termination notify signals from the D/A converters 11a and 11b, respectively, the computer 10 outputs the trigger generation request signal S10t to the trigger generator circuit 70, where the trigger generation request signal S10t represents an instruction to substantially simultaneously output the trigger signal S70 to the signal generator 22a and the receiver 21a. In response to this, the trigger generator circuit 70 generates the trigger signal S70, and substantially simultaneously outputs the same signal to the signal generator 22a and the receiver 21a. In response to this, the signal generator 22a and the receiver 21a substantially simultaneously stop the signal generating process and the receiving process, respectively. Further, the receiver 21a outputs the received data including the data of measured amplitudes and measured phases to the computer 10. The computer 10 evaluates the performance of the receiving antenna 60a based on the received data from the receiver 21a.

As described above in detail, according to the present preferred embodiment, the D/A converters 11a and 11b, the signal generator 22a and the receiver 21a substantially simultaneously starts the D/A conversion processes, the signal generating process and the receiving process, respectively, in response to the trigger signal S70. Namely, the operation start timings of the signal generator 22a, the transmitter circuits 30a and 30b and the receiver 21a constituting the evaluation circuit 80C are substantially synchronized with each other. Therefore, only by setting the initial phases $\alpha n$ of the radio wave transmitted from each scatterer antenna 50a-n in different antenna evaluating processes to be the same as each other, and setting the initial phases $\beta n$ of the radio wave transmitted from each scatterer antenna 50b-n in different antenna evaluating processes to be the same as each other, the multiple waves substantially the same as each other can be generated at the installation position of the receiving antenna 60a. Further, since it is possible to generate the multiple waves substantially the same as each other in each antenna evaluating process with higher reproducibility than that of the prior art, the measurement time interval Tm can be made shorter than that of the prior art. Therefore, the receiving antenna 60a can be evaluated in a time shorter than that of the prior art with an accuracy higher than that of the prior art. In addition, since the radio waves of vertical polarization and horizontal polarization are simultaneously radiated, it is possible to generate the multiple wave similar to a multiple wave generated in an actual fading environment can at the installation position of the receiving antenna 60a, as compared with the fading controlling and measuring apparatus 200A of the first preferred embodiment.

In the present preferred embodiment, the scatterer antennas 50a-1 to 50a-7 radiate the vertically polarized radio waves, and the scatterer antennas 50b-1 to 50b-7 radiate the vertically polarized radio waves, however, the present invention is not limited to this. In a configuration including a plurality of transmitter circuits configured in a manner similar to that of the transmitter circuit 30a, it is acceptable to synchronize process start timings of the D/A converters 11a, the signal generator 22a and the receiver 21a of the plurality of transmitter circuits with each other by using the trigger signal S70.

In addition, in the present preferred embodiment, the scatterer antenna 50b-n is provided so that the feeding point of the scatterer antenna 50b-n is positioned away from the feeding point of the scatterer antenna 50a-n by a distance $\lambda/2$ in a direction from the origin to the feeding point of the scatterer antenna 50a-n, however, the present invention is not limited to this. The scatterer antenna 50b-n may be provided so that the feeding point of the scatterer antenna 50b-n is positioned away from the feeding point of the scatterer antenna 50a-n by a distance $\lambda/2$ in a direction from the feeding point of the scatterer antenna 50a-n toward the origin.

Fourth Preferred Embodiment

Figure 8:
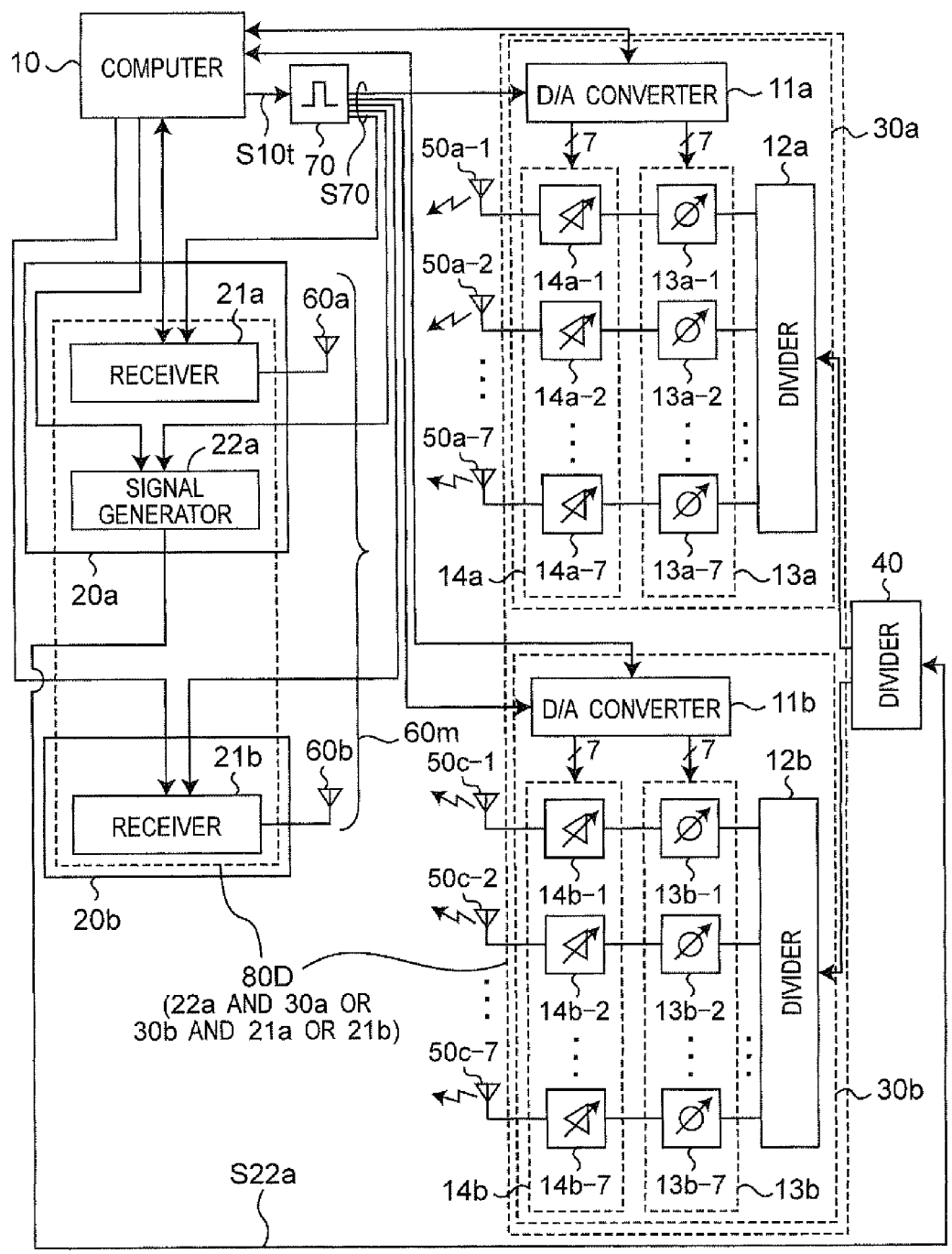
FIG. 8 is block diagram showing a configuration of a multiple wave controlling and measuring apparatus 200D according to a fourth preferred embodiment of the present invention.
Figure 9:
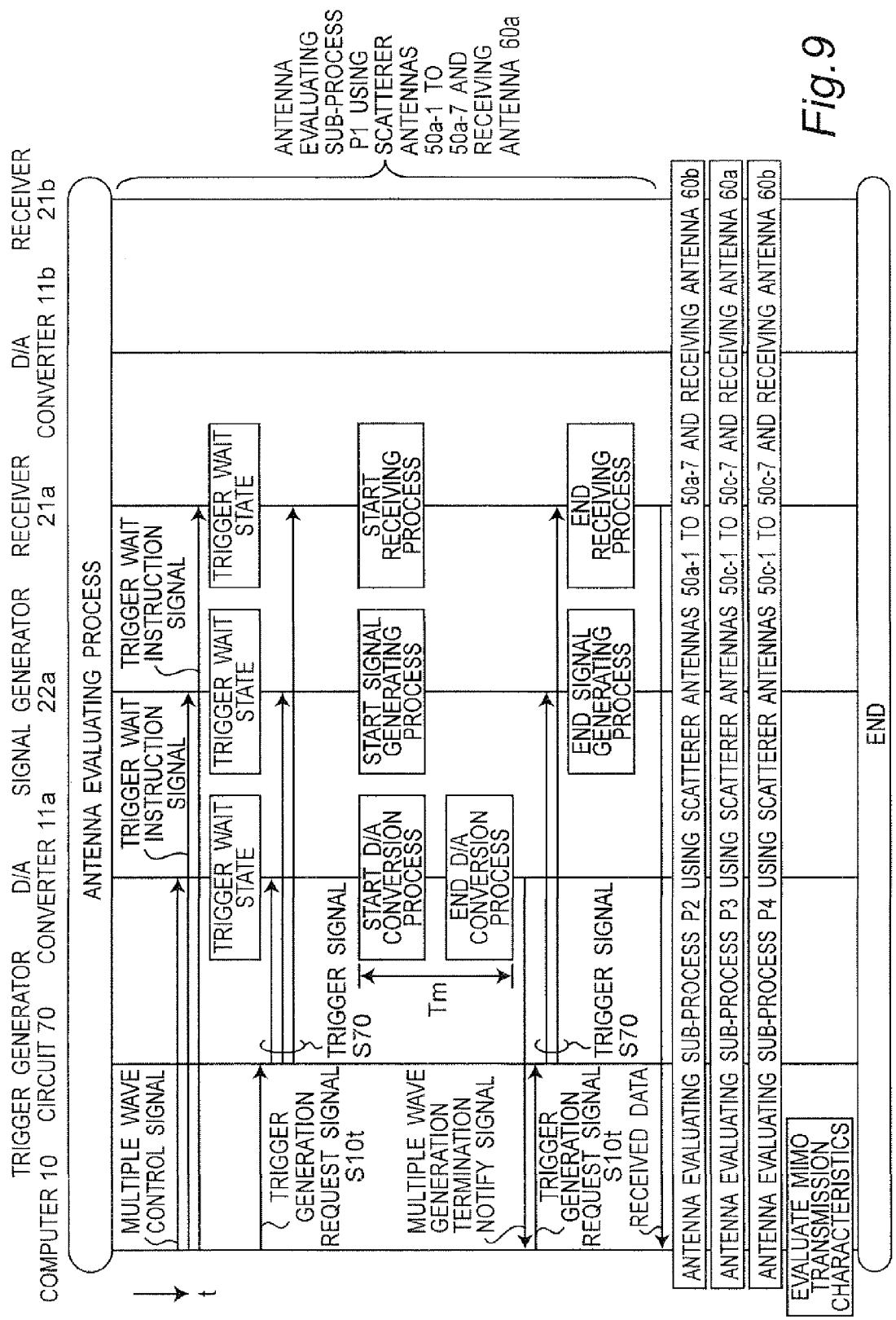
FIG. 9 is a sequence diagram showing an antenna evaluating process executed by the multiple wave controlling and measuring apparatus 200D of FIG. 8.

FIG. 8 is a block diagram showing a configuration of a multiple wave controlling and measuring apparatus 200D according to the fourth preferred embodiment of the present invention, and FIG. 9 is a sequence diagram showing an antenna evaluating process executed by the multiple wave controlling and measuring apparatus 200D of FIG. 8. The multiple wave controlling and measuring apparatus 200D of the present preferred embodiment is characterized by including scatterer antennas 50c-1 to 50c-7 for radiating vertically polarized radio waves instead of the scatterer antennas 50b-1 to 50b-7, and further including the network analyzer 20b including he receiver 21b, as compared with the multiple wave controlling and measuring apparatus 200C of the third preferred embodiment. It is noted that the receiving antenna 60b and the network analyzer 20b are constituted in a manner similar to that of the second preferred embodiment. In addition, in the present preferred embodiment, the antenna to be evaluated is a MIMO (Multiple Input Multiple Output (multi-input multi-output)) antenna 60m including the receiving antennas 60a and 60b of half-wave dipole antennas each for receiving vertically polarized radio waves.

Referring to FIG. 8, the receiving antennas 60a and 60b constitute a two-element MIMO antenna 60m. In addition, the scatterer antenna 50c-n is vertically installed to the scatterer antenna support base 101 so that the feeding point of the scatterer antenna 50c-n is positioned away from the feeding point of the scatterer antenna 50a-n by a distance $\lambda/2$ in a direction from the origin toward the feeding point of the scatterer antenna 50a-n, and so that the scatterer antenna 50c-n radiate a vertically polarized radio wave. For example, the coordinate positions in the XYZ coordinate system of the feeding points of the scatterer antennas 50a-1 and 50c-1 are (0, R, 0) and (0, R+$\lambda/2$, 0), respectively.

Next, with reference to FIG. 9, the antenna evaluating process executed by the multiple wave controlling and measuring apparatus 200D of FIG. 8 is described. First of all, an antenna evaluating sub-process P1 is executed by using the scatterer antennas 50a-1 to 50a-7 and the receiving antenna 60a in the multiple wave controlling and measuring apparatus 200D. In the antenna evaluating sub-process P1, the computer 10 selects the signal generator 22a, the transmitter circuit 30a and the receiver 21a to constitute an evaluation circuit 80D for evaluating the performance of the MIMO antenna 60m. The antenna evaluating sub-process P1 is the same as the process from the timing when the multiple wave control signal is transmitted to the timing when the received data is received by the computer 10 in the antenna evaluating process of FIG. 3. By the antenna evaluating sub-process P1, the computer 10 obtains the received data when the multiple wave of the vertically polarized radio waves radiated by the scatterer antennas 50a-1 to 50a-7 are received by the receiving antenna 60a.

Subsequently, in a manner similar to that of the antenna evaluating sub-process P1, an antenna evaluating sub-process P2 is executed by using the scatterer antennas 50a-1 to 50a-7 and the receiving antenna 60b. In the antenna evaluating sub-process P2, the computer 10 selects the signal generator 22a, the transmitter circuit 30a and the receiver 21b to constitute the evaluation circuit 80D for evaluating the performance of the MIMO antenna 60m. By the antenna evaluating sub-process P2, the computer 10 obtains the received data when the multiple wave of the vertically polarized radio waves radiated by the scatterer antennas 50a-1 to 50a-7 are received by the receiving antenna 60b. It is noted that the initial phase αn of the scatterer antenna 50a-n used in the antenna evaluating sub-process P2 is the same as the initial phase αn of the scatterer antenna 50a-n used in the antenna evaluating sub-process P1.

Next, in a manner similar to that of the antenna evaluating sub-process P1, an antenna evaluating sub-process P3 is executed by using the scatterer antennas 50c-1 to 50c-7 and the receiving antenna 60a. In the antenna evaluating sub-process P3, the computer 10 selects the signal generator 22a, the transmitter circuit 30b and the receiver 21a to constitute the evaluation circuit 80D for evaluating the performance of the MIMO antenna 60m. By the antenna evaluating sub-process P3, the computer 10 obtains the received data when the multiple wave of the vertically polarized radio waves radiated by the scatterer antennas 50c-1 to 50c-7 are received by the receiving antenna 60a. It is noted that an initial phase γn of the scatterer antenna 50c-n used in the antenna evaluating sub-process P3 is different from the initial phase αn corresponding to the scatterer antenna 50a-n used in the antenna evaluating sub-process P1.

Subsequently, in a manner similar to that of the antenna evaluating sub-process P1, an antenna evaluating sub-process P4 is executed by using the scatterer antennas 50c-1 to 50c-7 and the receiving antenna 60b. In the antenna evaluating sub-process P4, the computer 10 selects the signal generator 22a, the transmitter circuit 30b and the receiver 21b to constitute the evaluation circuit 80D for evaluating the performance of the MIMO antenna 60m. By the antenna evaluating sub-process P4, the computer 10 obtains the received data when the multiple wave of the vertically polarized radio waves radiated by the scatterer antennas 50c-1 to 50c-7 are received by the receiving antenna 60b. It is noted that the initial phase γn of the scatterer antenna 50c-n used in the antenna evaluating sub-process P4 is the same as the initial phase γn of the scatterer antenna 50c-n used in the antenna evaluating sub-process P3.

Then, the computer 10 calculates a MIMO channel response matrix based on the received data obtained in the antenna evaluating sub-processes P1 to P4, and evaluates the MIMO transmission characteristics such as MIMO eigenvalues and capacity of transmission.

As described above in detail, according to the present preferred embodiment, the operation start timings of the signal generator 22a, the transmitter circuit 30a and the receiver 21a, which constitute the evaluation circuit 80D in the antenna evaluating sub-process P1, are substantially synchronized with each other, and the operation start timings of the signal generator 22a, the transmitter circuit 30a and the receiver 21b, which constitute the evaluation circuit 80D in the antenna evaluating sub-process P2, are substantially synchronized with each other. Further, the initial phase αn of the scatterer antenna 50a-n used in the antenna evaluating sub-process P2 is the same as the initial phase αn of the scatterer antenna 50a-n used in the antenna evaluating sub-process P1. Therefore, the multiple waves substantially the same as each other are generated in the antenna evaluating sub-processes P1 and P2. In a manner similar to above, the multiple waves substantially the same as each other are generated in the antenna evaluating sub-processes P3 and P4. Therefore, it is possible to generate the multiple waves with the reproducibility higher than that of the prior art, and the MIMO antenna 60m can be evaluated in a time shorter than that of the prior art with an accuracy higher than that of the prior art.

Fifth Preferred Embodiment

Figure 10:
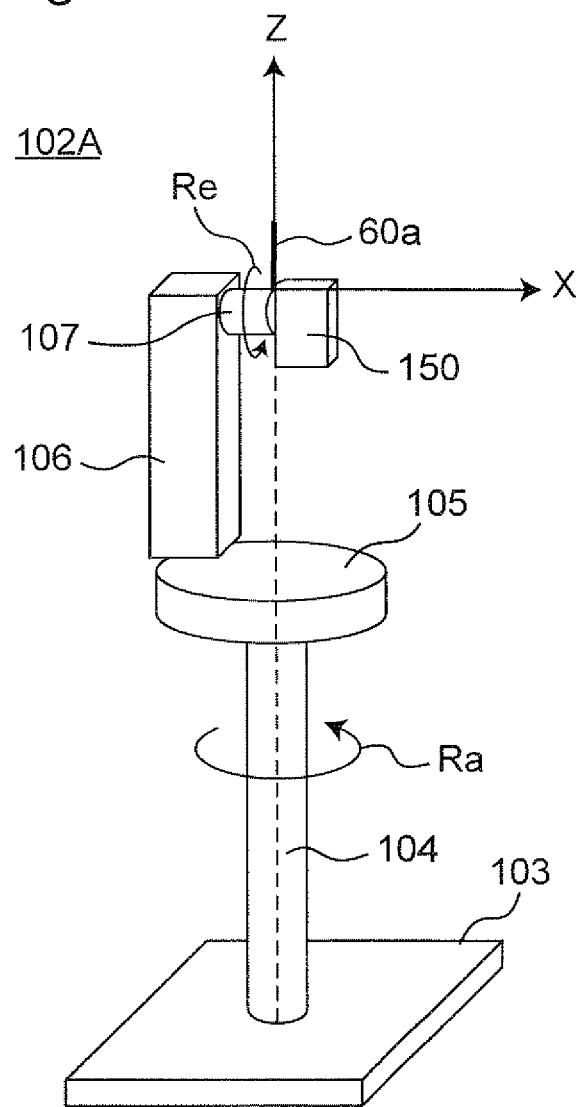
FIG. 10 is a perspective view of a receiving antenna support base 102A according to a fifth preferred embodiment of the present invention.
Figure 11:
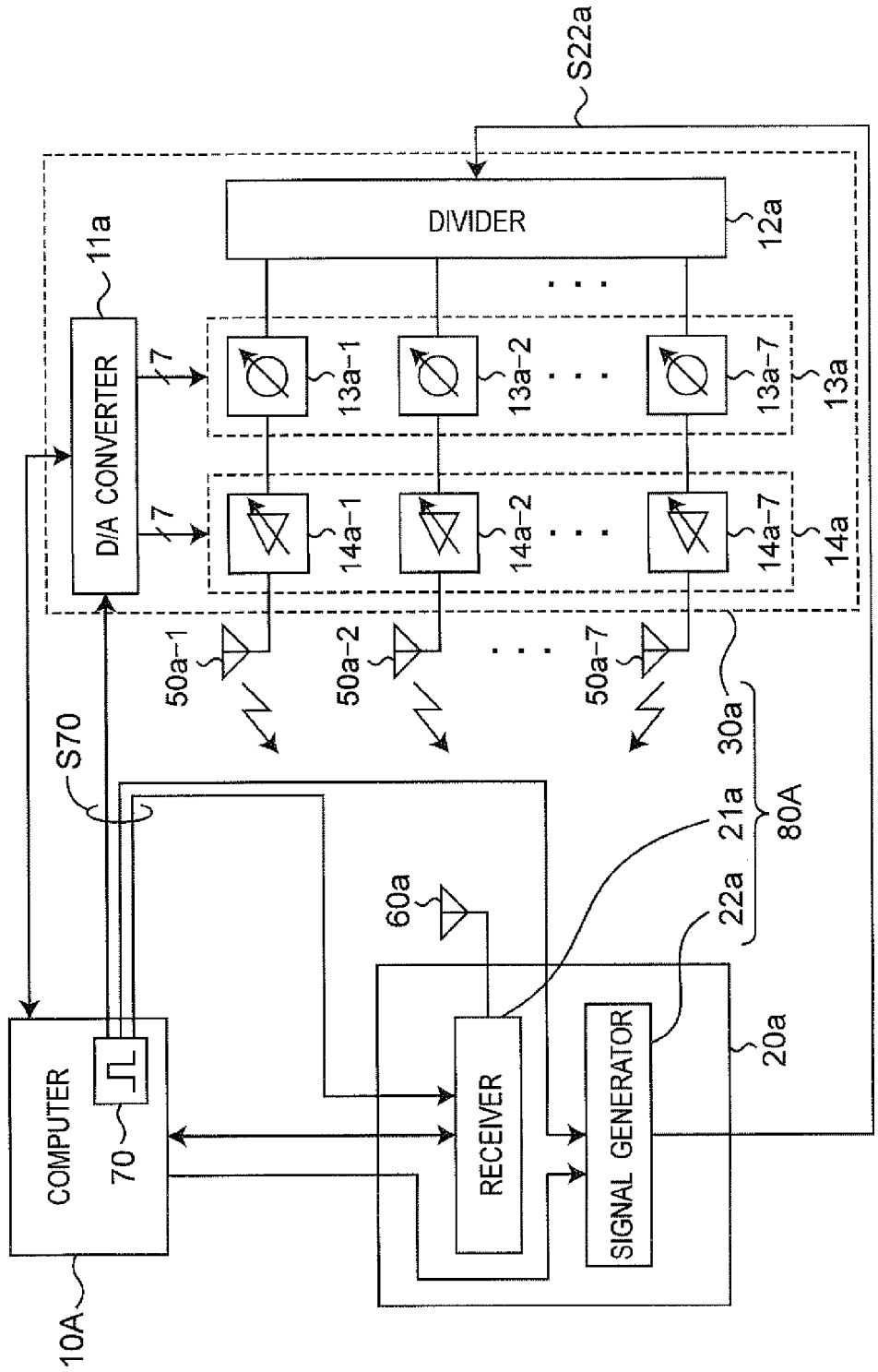
FIG. 11 is a block diagram showing a configuration of a multiple wave controlling and measuring apparatus 200E according to a modified preferred embodiment of the first preferred embodiment of the present invention.
Figure 12:
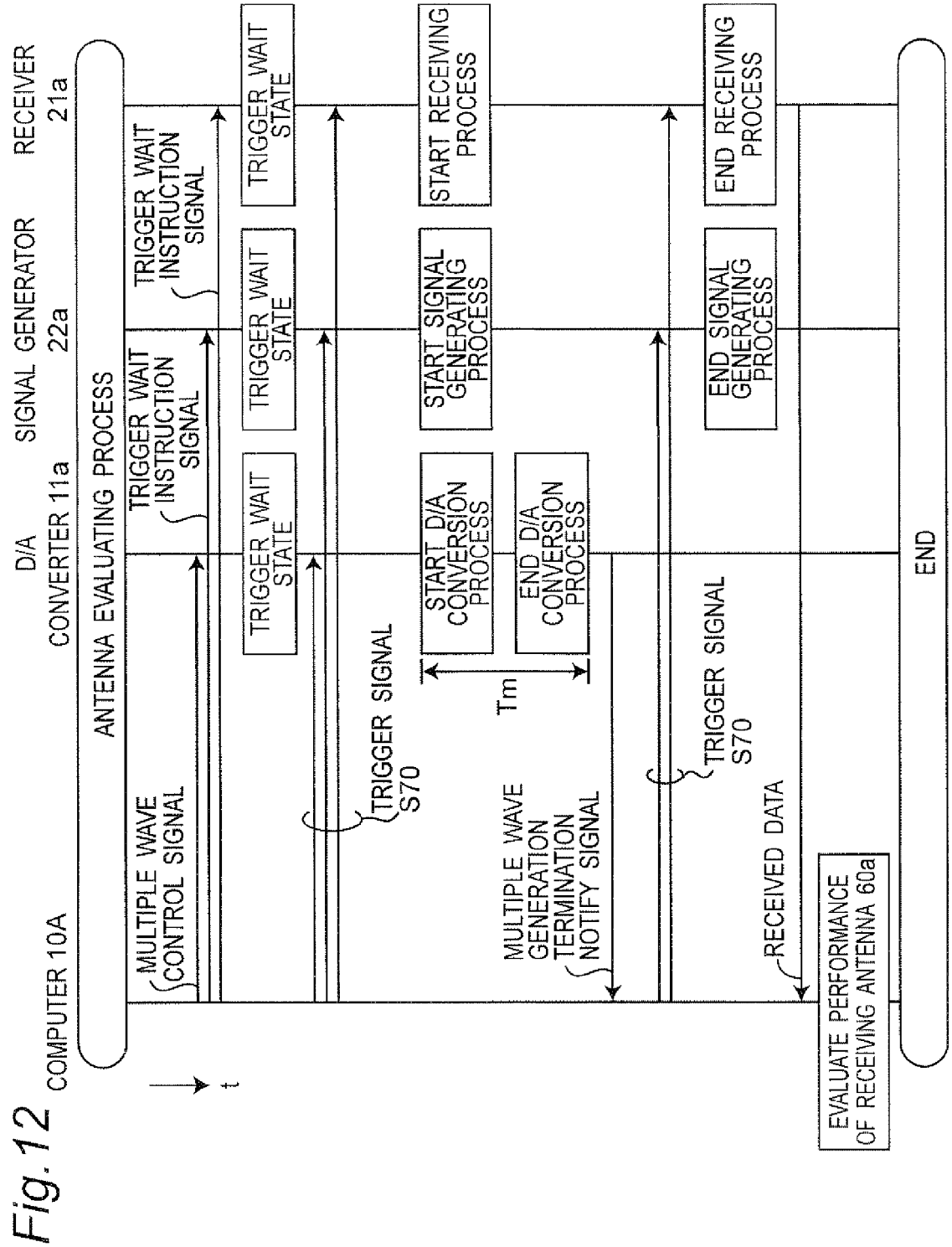
FIG. 12 is a sequence diagram showing an antenna evaluating process executed by the multiple wave controlling and measuring apparatus 200E of FIG. 11.

FIG. 10 is a perspective view of a receiving antenna support base 102A according to the fifth preferred embodiment of the present invention. Referring to FIG. 10, the receiving antenna support base 102A is configured by including a base 103, a pole 104 that rotates in a rotation direction Ra about the Z-axis of a rotation axis, a table 105 fixed on the pole 104, a pole 106 fixed to an edge portion of the table 105, and a receiving antenna attaching member 107, which is provided at an upper end portion of the pole 106 and rotates in a rotation direction Re about a rotation axis parallel to the XY plane. It is noted that the base 103, the pole 104, the table 105, the pole 106 and the receiving antenna attaching member 107 are formed of resin. In addition, the receiving antenna 60a is attached to a portable telephone 150 fixed to the receiving antenna attaching member 107. According to the present preferred embodiment, by fixing the pole 104 turned by a predetermined angle and fixing the receiving antenna attaching member 107 turned by a predetermined angle, the performance of the receiving antenna 60a can be evaluated with an elevation angle (angle to the Z-axis) of the receiving antenna 60a and the azimuth of the receiving antenna 60a set to a desired elevation angle and a desired azimuth, respectively. With this arrangement, the performance of the receiving antenna 60a can be evaluated in an environment in which the portable telephone 150 is actually used. With an accuracy higher than that of Modified Preferred Embodiment of First Preferred Embodiment FIG. 11 is a block diagram showing a configuration of a multiple wave controlling and measuring apparatus 200E according to a modified preferred embodiment of the first preferred embodiment of the present invention. FIG. 12 is a sequence diagram showing an antenna evaluating process executed by the multiple wave controlling and measuring apparatus 200E of FIG. 11. The multiple wave controlling and measuring apparatus 200E of the present modified preferred embodiment is characterized by including a computer 10A including a trigger generator circuit 70 instead of the computer 10, as compared with the multiple wave controlling and measuring apparatus 200A of the first preferred embodiment.

Referring to FIG. 11, the computer 10A generates the trigger signal S70 at a predetermined timing, and outputs the same signal to at least one of the D/A converter 11a, the signal generator 22a and the receiver 21a. In addition, the D/A converter 11a, the signal generator 22a and the receiver 21a operate in response to the trigger signal S70 from the computer 10A in manners similar to those of the D/A converter 11a, the signal generator 22a and the receiver 21a of the first preferred embodiment, respectively.

Next, with reference to FIG. 12, the antenna evaluating process executed by the multiple wave controlling and measuring apparatus 200E of FIG. 11 is described. First of all, the computer 10A generates the multiple wave control signal, and outputs the same signal to the D/A converter 11a. In response to this, the D/A converter 11a is put into the trigger wait state. Further, the computer 10A outputs the trigger wait instruction signal to the signal generator 22a and the receiver 21a, where the trigger wait instruction signal represents an instruction to wait for the trigger signal S70. In response to this, the signal generator 22a and the receiver 21a are each put into the trigger wait state. Next, the computer 10A generates the trigger signal S70, and substantially simultaneously outputs the same signal to the D/A converter 11a, the signal generator 22a and the receiver 21a.

In response to the trigger signal S70, the D/A converter 11a starts the D/A conversion process for converting the multiple wave control signal received from the computer 10A into the phase shift amount control voltages for the phase shifters 13a-1 to 13a-7 and the attenuation amount control voltages for the attenuators 14a-1 to 14a-7. By this operation, the transmitter circuit 30a starts the wireless transmission operation. Then, the D/A converter 11a stops the D/A conversion process when the measurement time interval Tm has elapsed, and outputs the multiple wave generation termination notify signal to the computer 10A, where the multiple wave generation termination notify signal represents a notification that the generation of the multiple wave has been stopped. On the other hand, the signal generator 22a and the receiver 21a start the signal generating process and the receiving process, respectively, in response to the trigger signal S70. In this case, the D/A conversion process, the signal generating process and the receiving process are substantially simultaneously started.

In response to the multiple wave generation termination notify signal, the computer 10A generates the trigger signal S70, and substantially simultaneously outputs the same signal to the signal generator 22a and the receiver 21a. In response to this, the signal generator 22a and the receiver 21a substantially simultaneously stop the signal generating process and the receiving process, respectively. Further, the receiver 21a outputs the received data including the measured amplitudes and phases to the computer 10A. The computer 10A evaluates the performance of the receiving antenna 60a based on the received data from the receiver 21a.

As described above, the multiple wave controlling and measuring apparatus 200E of the present modified preferred embodiment exhibits advantageous effects similar to those of the multiple wave controlling and measuring apparatus 200A of the first preferred embodiment.

Modified Preferred Embodiment of Second Preferred Embodiment

Figure 13:
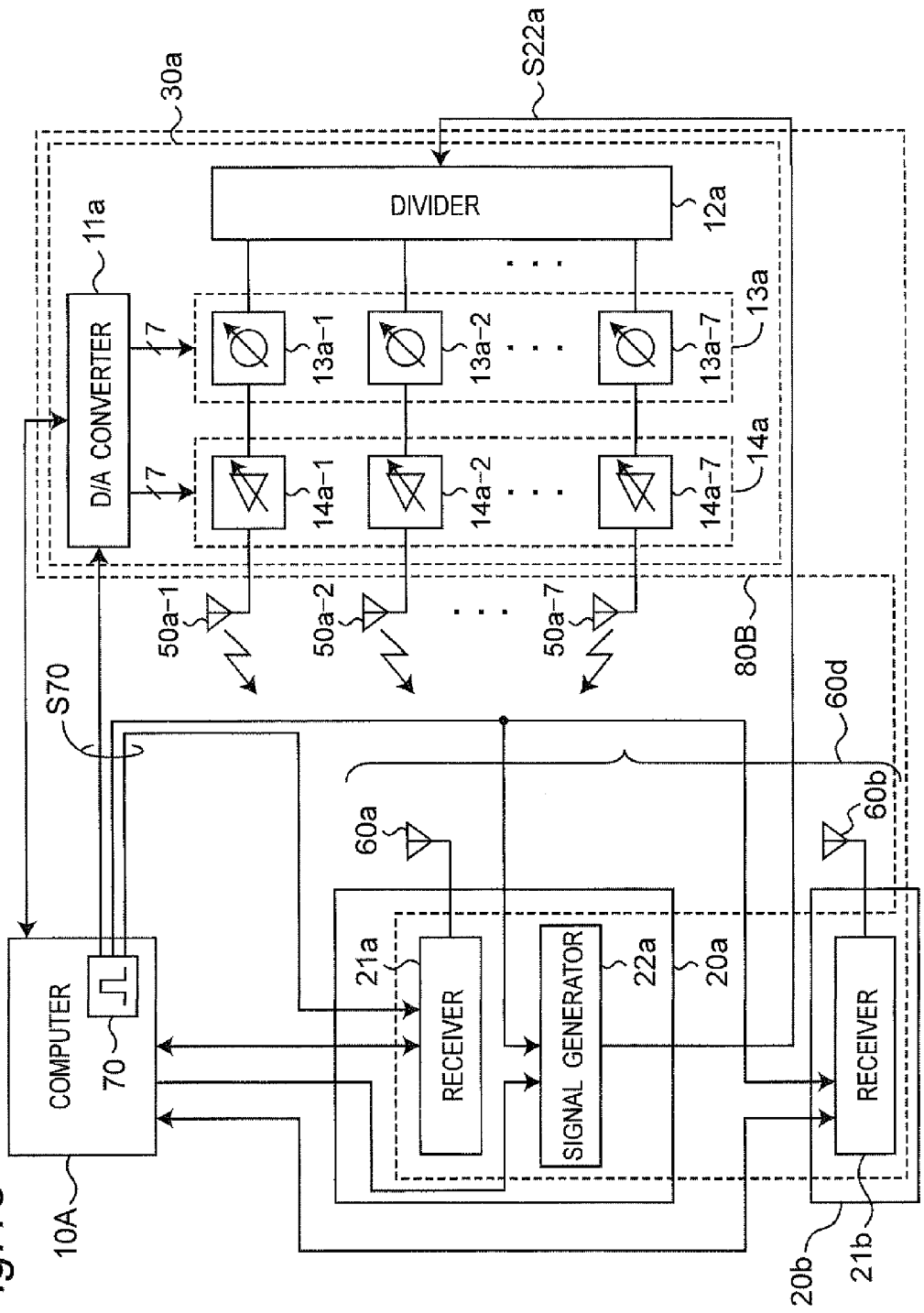
FIG. 13 is a block diagram showing a configuration of a multiple wave controlling and measuring apparatus 200F according to a modified preferred embodiment of the second preferred embodiment of the present invention.
Figure 14:
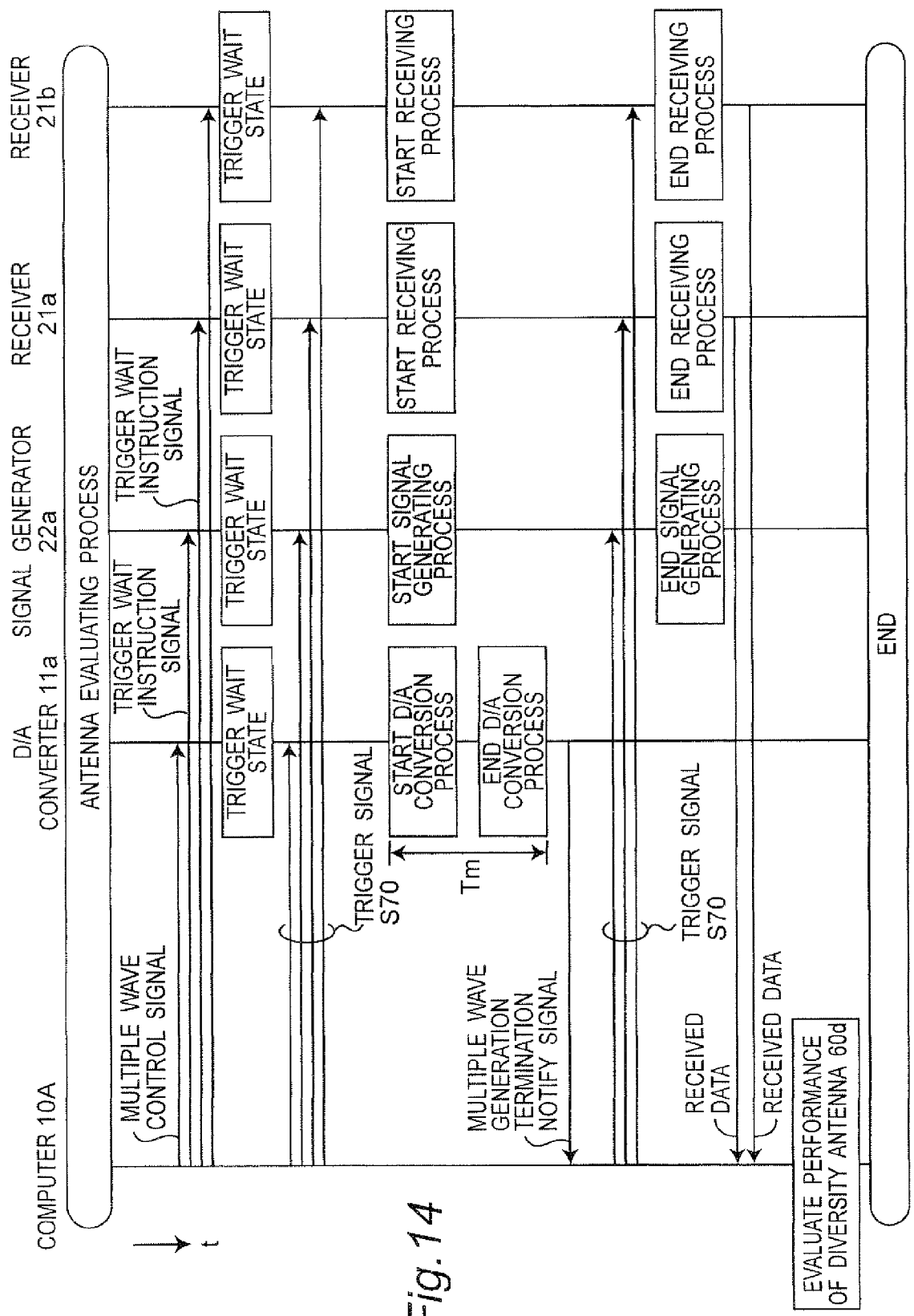
FIG. 14 is a sequence diagram showing an antenna evaluating process executed by the multiple wave controlling and measuring apparatus 200F of FIG. 13.

FIG. 13 is a block diagram showing a configuration of a multiple wave controlling and measuring apparatus 200F according to a modified preferred embodiment of the second preferred embodiment of the present invention. FIG. 14 is a sequence diagram showing an antenna evaluating process executed by the multiple wave controlling and measuring apparatus 200F of FIG. 13. The multiple wave controlling and measuring apparatus 200F of the present modified preferred embodiment is characterized by including the computer 10A including the trigger generator circuit 70 instead of the computer 10, as compared with the multiple wave controlling and measuring apparatus 200B of the second preferred embodiment.

Referring to FIG. 13, the computer 10A generates the trigger signal S70 at a predetermined timing, and outputs the same signal to at least one of the D/A converter 11a, the signal generator 22a and the receivers 21a and 21b. In addition, the D/A converter 11a, the signal generator 22a, the receiver 21a and the receiver 21b operate in response to the trigger signal S70 from the computer 10A in manners similar to those of the D/A converter 11a, the signal generator 22a, the receiver 21a and the receiver 21b of the second preferred embodiment, respectively.

Next, with reference to FIG. 14, the antenna evaluating process executed by the multiple wave controlling and measuring apparatus 200F of FIG. 13 is described. First of all, the computer 10A generates the multiple wave control signal, and outputs the same signal to the D/A converter 11a. In response to this, the D/A converter 11a is put into the trigger wait state. Further, the computer 10A outputs the trigger wait instruction signal to the signal generator 22a and the receivers 21a and 21b, where the trigger wait instruction signal represents an instruction to wait for the trigger signal S70. In response to this, the signal generator 22a and the receivers 21a and 21b are each put into the trigger wait state. Next, the computer 10A generates the trigger signal S70, and substantially simultaneously outputs the same signal to the D/A converter 11a, the signal generator 22a, and the receivers 21a and 21b.

In response to the trigger signal S70, the D/A converter 11a starts the D/A conversion process for converting the multiple wave control signal received from the computer 10A into the phase shift amount control voltages for the phase shifters 13a-1 to 13a-7 and the attenuation amount control voltages for the attenuators 14a-1 to 14a-7. By this operation, the transmitter circuit 30a starts the wireless transmission operation. Then, the D/A converter 11a stops the D/A conversion process when the measurement time interval Tm has elapsed, and outputs the multiple wave generation termination notify signal to the computer 10A, where the multiple wave generation termination notify signal represents a notification that the generation of the multiple wave has been stopped. On the other hand, the signal generator 22a starts the signal generating process in response to the trigger signal S70. In addition, each of the receivers 21a and 21b starts the receiving process in response to the trigger signal S70. In this case, the D/A conversion process, the signal generating process and the receiving processes by the receivers 21a and 21b are substantially simultaneously started.

In response to the multiple wave generation termination notify signal, the computer 10A generates the trigger signal S70, and substantially simultaneously outputs the same signal to the signal generator 22a, and the receivers 21a and 21b. In response to this, the signal generator 22a, and the receivers 21a and 21b substantially simultaneously stop the signal generating process and the receiving processes, respectively. Further, the receivers 21a and 21b output the received data including the data of the measured amplitudes and phases to the computer 10A. The computer 10A evaluates the performance of the diversity antenna 60d based on the received data from the receivers 21a and 21b.

As described above, the multiple wave controlling and measuring apparatus 200F of the present modified preferred embodiment exhibits advantageous effects similar to those of the multiple wave controlling and measuring apparatus 200B of the second preferred embodiment.

Modified Preferred Embodiment of Third Preferred Embodiment

Figure 15:
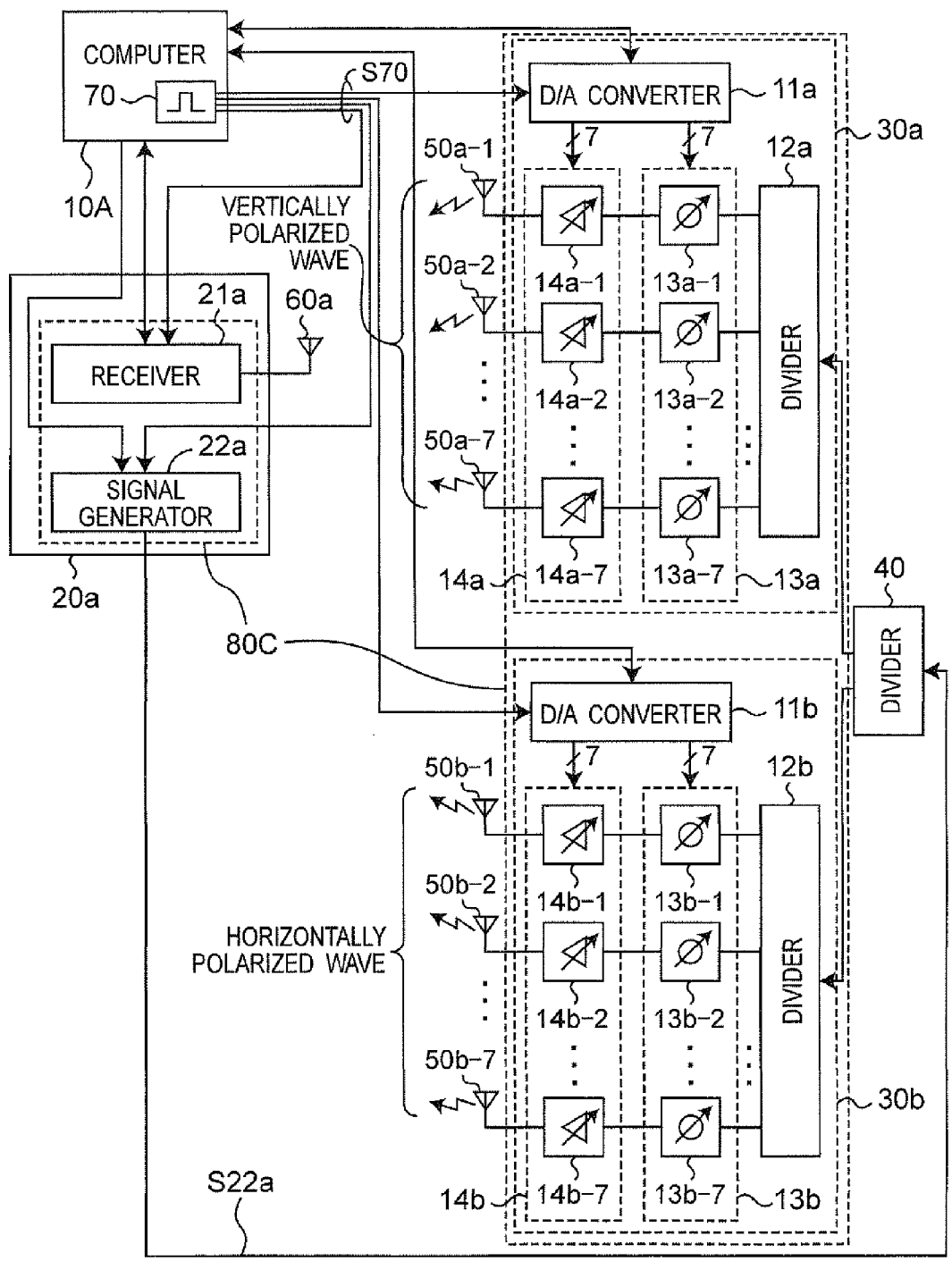
FIG. 15 is a block diagram showing a configuration of a multiple wave controlling and measuring apparatus 200G according to a modified preferred embodiment of the third preferred embodiment of the present invention.
Figure 16:
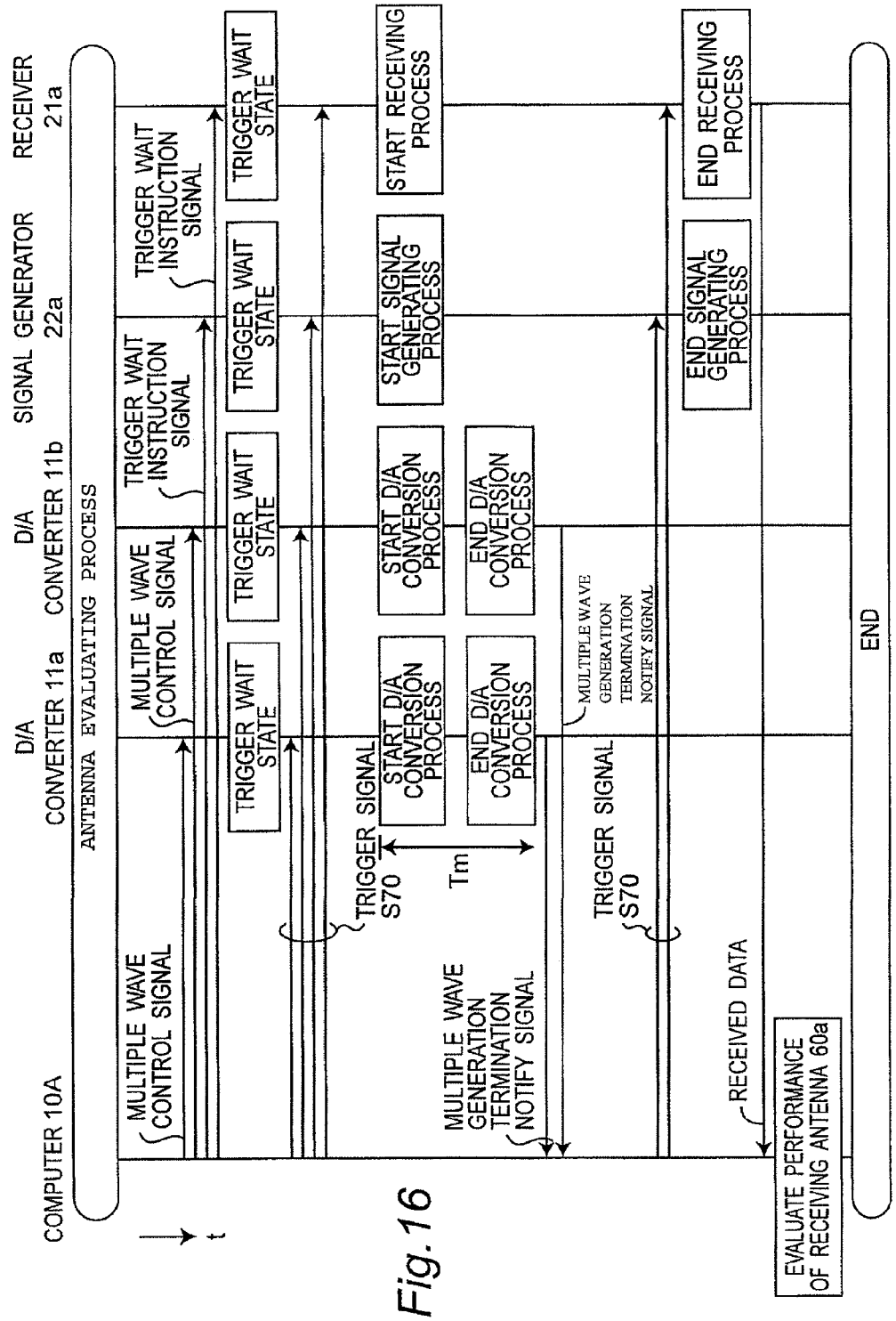
FIG. 16 is a sequence diagram showing an antenna evaluating process executed by the multiple wave controlling and measuring apparatus 200G of FIG. 15.

FIG. 15 is a block diagram showing a configuration of a multiple wave controlling and measuring apparatus 200G according to a modified preferred embodiment of the third preferred embodiment of the present invention. FIG. 16 is a sequence diagram showing an antenna evaluating process executed by the multiple wave controlling and measuring apparatus 200G of FIG. 15. The multiple wave controlling and measuring apparatus 200G of the present modified preferred embodiment is characterized by including the computer 10A including the trigger generator circuit 70 instead of the computer 10, as compared with the multiple wave controlling and measuring apparatus 200C of the third preferred embodiment.

Referring to FIG. 15, the computer 10A generates the trigger signal S70 at a predetermined timing, and outputs the same signal to at least one of the D/A converters 11a and 11b, the signal generator 22a and the receiver 21a. In addition, the D/A converters 11a and 11b, the signal generator 22a and the receiver 21a operate in response to the trigger signal S70 from the computer 10A in manners similar to those of the D/A converters 11a and 11b, the signal generator 22a and the receiver 21a of the third preferred embodiment.

Next, with reference to FIG. 16, the antenna evaluating process executed by the multiple wave controlling and measuring apparatus 200G of FIG. 15 is described. First of all, the computer 10A generates the multiple wave control signals for the D/A converters 11a and 11b, and outputs the same signals to the D/A converters 11a and 11b, respectively. In response to this, the D/A converters 11a and 11b are put into the trigger wait state. Further, the computer 10A outputs the trigger wait instruction signal to the signal generator 22a and the receiver 21a, where the trigger wait instruction signal represents an instruction to wait for the trigger signal S70. In response to this, the signal generator 22a and the receiver 21a are each put into the trigger wait state. Next, the computer 10A generates the trigger signal S70, and outputs the same signal substantially simultaneously to the D/A converters 11a and 11b, the signal generator 22a and the receiver 21a.

In response to the trigger signal S70, the D/A converter 11a starts the D/A conversion process for converting the multiple wave control signal received from the computer 10A into the phase shift amount control voltages for the phase shifters 13a-1 to 13a-7 and the attenuation amount control voltages for the attenuators 14a-1 to 14a-7. By this operation, the transmitter circuit 30a starts wireless transmission operation. Then, the D/A converter 11a stops the D/A conversion process when the measurement time interval Tm has elapsed, and outputs the multiple wave generation termination notify signal to the computer 10A, where the multiple wave generation termination notify signal represents a notification that the generation of the multiple wave has been stopped. In addition, in response to the trigger signal S70, the D/A converter 11b starts the D/A conversion process for converting the multiple wave control signal received from the computer 10A into the phase shift amount control voltages for the phase shifters 13b-1 to 13b-7 and the attenuation amount control voltages for the attenuators 14b-1 to 14b-7. By this operation, the transmitter circuit 30b starts the wireless transmission operation. Then, the D/A converter 11b stops the D/A conversion process when the measurement time interval Tm has elapsed, and outputs the multiple wave generation termination notify signal to the computer 10A, where the multiple wave generation termination notify signal represents a notification that the generation of the multiple wave has been stopped. On the other hand, the signal generator 22a and the receiver 21a start the signal generating process and the receiving process, respectively, in response to the trigger signal S70. In this case, the D/A conversion process by the D/A converters 11a and 11b, the signal generating process and the receiving process are substantially simultaneously started.

Upon receiving the multiple wave generation termination notify signals from the D/A converters 11a and 11b, the computer 10A generates the trigger signal S70, and substantially simultaneously outputs the same signal to the signal generator 22a and the receiver 21a. In response to this, the signal generator 22a and the receiver 21a substantially simultaneously stop the signal generating process and the receiving process, respectively. Further, the receiver 21a outputs the received data including the data of the measured amplitudes and phases to the computer 10A. The computer 10A evaluates the performance of the receiving antenna 60a based on the received data from the receiver 21a.

As described above, the multiple wave controlling and measuring apparatus 200G of the present modified preferred embodiment exhibits advantageous effects similar to those of the multiple wave controlling and measuring apparatus 200C of the third preferred embodiment.

Modified Preferred Embodiment of Fourth Preferred Embodiment

Figure 17:
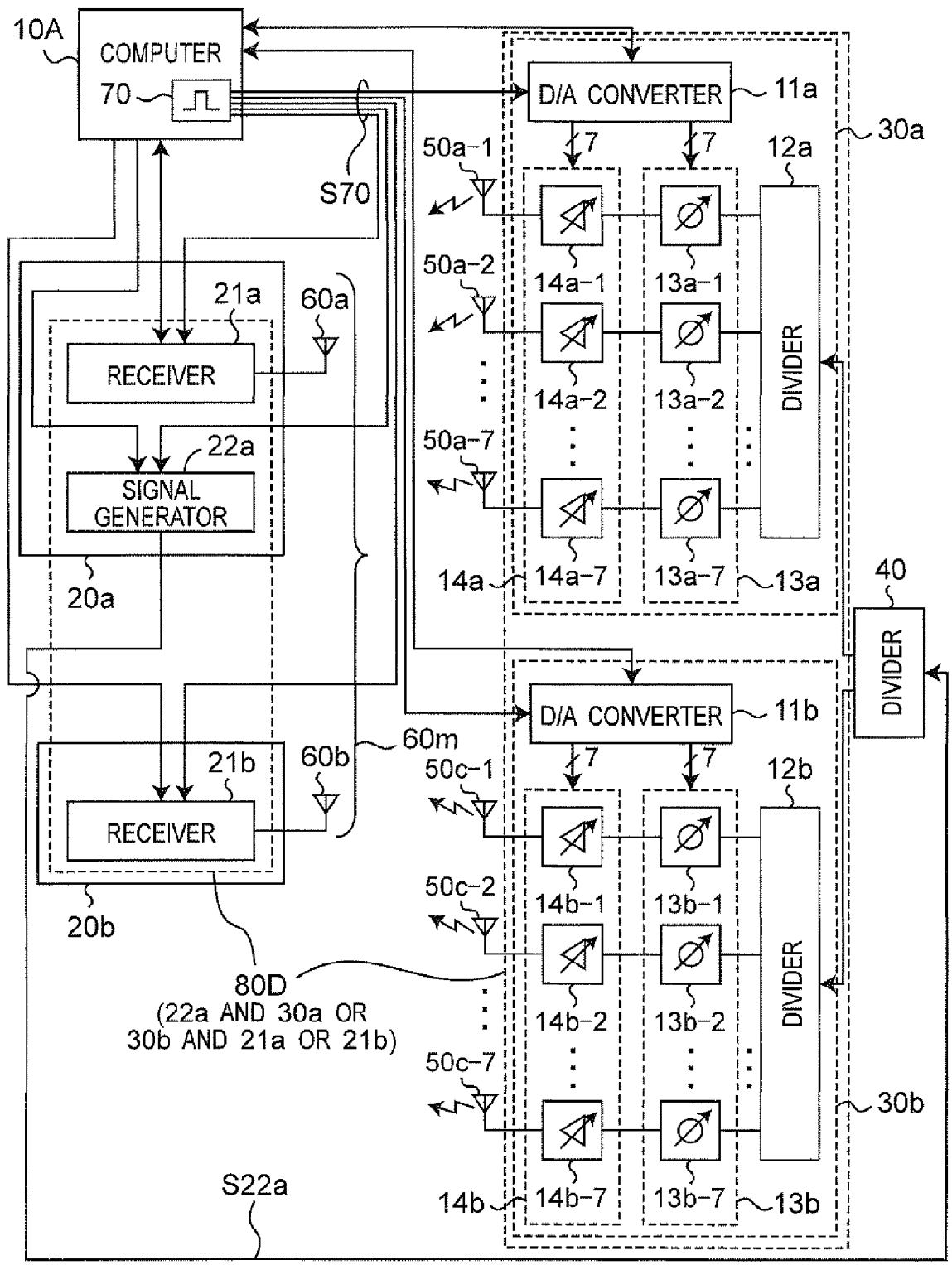
FIG. 17 is a block diagram showing a configuration of a multiple wave controlling and measuring apparatus 200H according to a modified preferred embodiment of the fourth preferred embodiment of the present invention.
Figure 18:
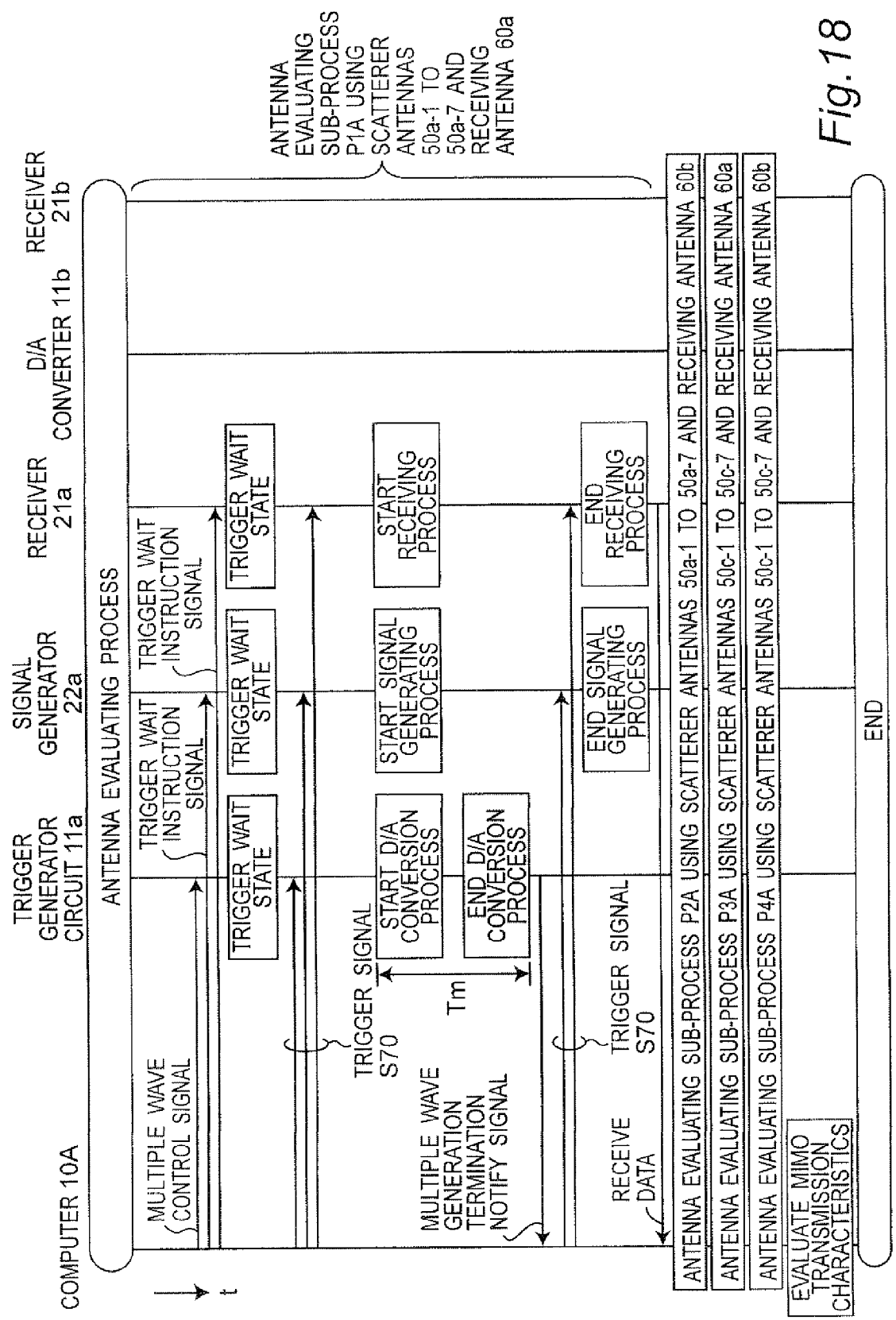
FIG. 18 is a sequence diagram showing an antenna evaluating process executed by the multiple wave controlling and measuring apparatus 200H of FIG. 17.
Figure 19:
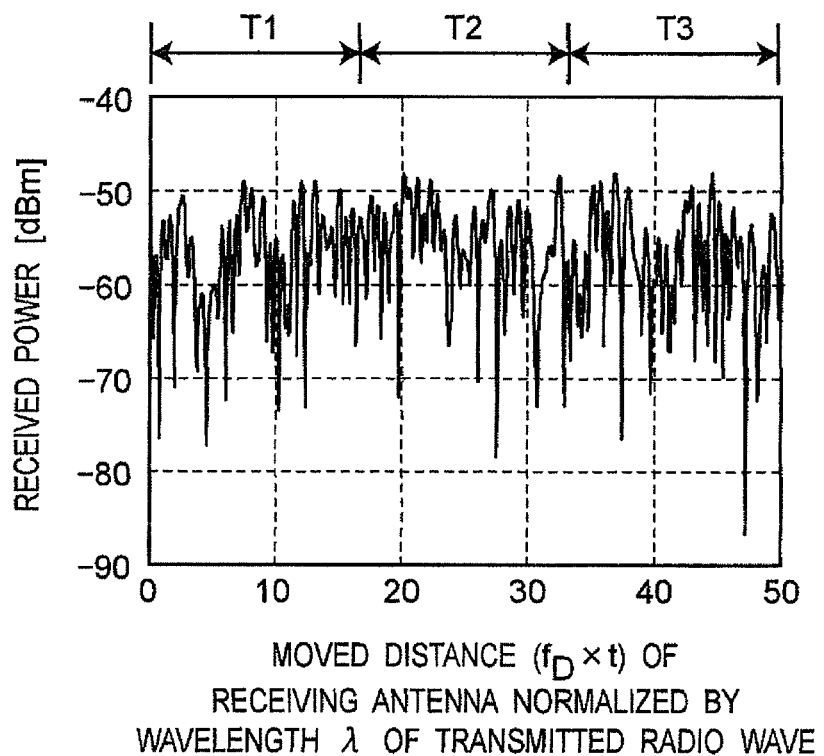
FIG. 19 is a graph showing one example of a received power received by using a prior art antenna evaluating apparatus.

FIG. 17 is a block diagram showing a configuration of a multiple wave controlling and measuring apparatus 200H according to a modified preferred embodiment of the fourth preferred embodiment of the present invention. FIG. 18 is a sequence diagram showing an antenna evaluating process executed by the multiple wave controlling and measuring apparatus 200H of FIG. 17. The multiple wave controlling and measuring apparatus 200H of the present modified preferred embodiment is characterized by including the computer 10A including the trigger generator circuit 70 instead of the computer 10, as compared with the multiple wave controlling and measuring apparatus 200D of the third preferred embodiment.

Referring to FIG. 17, the computer 10A generates the trigger signal S70 at a predetermined timing, and outputs the same signal to at least one of the D/A converters 11a and 11b, the signal generator 22a and the receiver 21a. In addition, the D/A converters 11a and 11b, the signal generator 22a and the receiver 21a operate in response to the trigger signal S70 from the computer 10A in manners similar to those of the D/A converters 11a and 11b, the signal generator 22a and the receiver 21a of the third preferred embodiment, respectively.

Next, with reference to FIG. 18, the antenna evaluating process executed by the multiple wave controlling and measuring apparatus 200H of FIG. 17 is described. First of all, in the multiple wave controlling and measuring apparatus 200H, an antenna evaluating sub-process P1A is executed by using the scatterer antennas 50a-1 to 50a-7 and the receiving antenna 60a. In the antenna evaluating sub-process P1A, the computer 10 selects the signal generator 22a, the transmitter circuit 30a and the receiver 21a to constitute the evaluation circuit 80D for evaluating the performance of the MIMO antenna 60m. The antenna evaluating sub-process P1A is the same as the process from the timing when the multiple wave control signal is transmitted to the timing when the received data is received by the computer 10A in the antenna evaluating process of FIG. 12. By the antenna evaluating sub-process P1A, the computer 10A obtains the received data when the multiple wave of the vertically polarized radio waves radiated by the scatterer antennas 50a-1 to 50a-7 are received by the receiving antenna 60a.

Subsequently, in a manner similar to that of the antenna evaluating sub-process P1A, an antenna evaluating sub-process P2A is executed by using the scatterer antennas 50a-1 to 50a-7 and the receiving antenna 60b. In the antenna evaluating sub-process P2A, the computer 10A selects the signal generator 22a, the transmitter circuit 30a and the receiver 21b to constitute the evaluation circuit 80D for evaluating the performance of the MIMO antenna 60m. By the antenna evaluating sub-process P2A, the computer 10A obtains the received data when the multiple wave of the vertically polarized radio waves radiated by the scatterer antennas 50a-1 to 50a-7 are received by the receiving antenna 60b. It is noted that the initial phase αn of the scatterer antenna 50a-n used in the antenna evaluating sub-process P2A is the same as the initial phase cm of the scatterer antenna 50a-n used in the antenna evaluating sub-process P1A.

Next, in a manner similar to that of the antenna evaluating sub-process P1A, an antenna evaluating sub-process P3A is executed by using the scatterer antennas 50c-1 to 50c-7 and the receiving antenna 60a. In the antenna evaluating sub-process P3A, the computer 10A selects the signal generator 22a, the transmitter circuit 30b and the receiver 21a to constitute the evaluation circuit 80D for evaluating the performance of the MIMO antenna 60m. By the antenna evaluating sub-process P3A, the computer 10A obtains the received data when the multiple wave of the vertically polarized radio waves radiated by the scatterer antennas 50c-1 to 50c-7 are received by the receiving antenna 60a. It is noted that the initial phase γn of the scatterer antenna 50c-n used in the antenna evaluating sub-process P3A is different from the initial phase αn corresponding to the scatterer antenna 50a-n used in the antenna evaluating sub-process P1A.

Subsequently, in a manner similar to that of the antenna evaluating sub-process P1A, an antenna evaluating sub-process P4A is executed by using the scatterer antennas 50c-1 to 50c-7 and the receiving antenna 60b. In the antenna evaluating sub-process P4A, the computer 10A selects the signal generator 22a, the transmitter circuit 30b and the receiver 21b to constitute the evaluation circuit 80D for evaluating the performance of the MIMO antenna 60m. By the antenna evaluating sub-process P4, the computer 10A obtains the received data when the multiple wave of the vertically polarized radio waves radiated by the scatterer antennas 50c-1 to 50c-7 are received by the receiving antenna 60b. It is noted that the initial phase γn of the scatterer antenna 50c-n used in the antenna evaluating sub-process P4A is the same as the initial phase γn of the scatterer antenna 50c-n used in the antenna evaluating sub-process P3A.

Then, the computer 10A calculates the MIMO channel response matrix based on the received data obtained in the antenna evaluating sub-processes P1A to P4A, and evaluates the MIMO transmission characteristics such as the MIMO eigenvalues and the capacity of transmission.

As described above, the multiple wave controlling and measuring apparatus 200G of the present modified preferred embodiment exhibits advantageous effects similar to those of the multiple wave controlling and measuring apparatus 200D of the third preferred embodiment.

In the fourth preferred embodiment, it is acceptable to simultaneously execute the antenna evaluating sub-processes P1 and P2, and to simultaneously execute the antenna evaluating sub-processes P3 and P4. In this case, the process for simultaneously executing the antenna evaluating sub-processes P1 and P2, and the process for simultaneously executing the antenna evaluating sub-processes P3 and P4 are each similar to the antenna evaluating process of the second preferred embodiment. Further, the initial phase γn of the scatterer antenna 50c-n used in the antenna evaluating sub-process P3 is different from the initial phase αn corresponding to the scatterer antenna 50a-n used in the antenna evaluating sub-process P1, and therefore, the antenna evaluating sub-processes P1 and P3 cannot simultaneously be executed. However, by using the transmitter circuit 30a instead of the transmitter circuit 30b in the antenna evaluating sub-process P3, the circuit size of the entire antenna evaluating apparatus can be made smaller than that of the fourth preferred embodiment by eliminating the transmitter circuit 30b.

In addition, it is acceptable to simultaneously execute the antenna evaluating sub-processes P1A and P2A, and to simultaneously execute the antenna evaluating sub-processes P3A and P4A in the modified preferred embodiment of the fourth preferred embodiment. In this case, the process for simultaneously executing the antenna evaluating sub-processes P1A and P2A, and the process for simultaneously executing the antenna evaluating sub-processes P3A and P4A are each similar to the antenna evaluating process of the modified preferred embodiment of the second preferred embodiment. Further, the initial phase γn of the scatterer antenna 50c-n used in the antenna evaluating sub-process P3A is different from the initial phase αn corresponding to the scatterer antenna 50a-n used in the antenna evaluating sub-process P1A, and therefore, the antenna evaluating sub-processes P1A and P3A cannot simultaneously be executed. However, by using the transmitter circuit 30a instead of transmitter circuit 30b in the antenna evaluating sub-process P3A, the circuit size of the entire antenna evaluating apparatus can be made smaller than that of the modified preferred embodiment of the fourth preferred embodiment by eliminating the transmitter circuit 30b.

In addition, in the fourth preferred embodiment and the modified preferred embodiment thereof, it is acceptable to provide first and second transceiver apparatuses instead of the network analyzers 20a and 20b, where each of the transceiver apparatuses includes the signal generator 22a, a modulator for generating a modulation wave signal by modulating a predetermined carrier signal according to the transmitting signal S22a, a demodulator for demodulating the received signal received by using the receiving antenna 60a, and the receiver 21a for executing a receiving process of the demodulated received signal. In this case, the first and second transceiver apparatuses generate modulation wave signals orthogonal to each other, and output the same signals to the dividers 12a and 12b, respectively. Further, the start timings of the signal generating processes executed by the two signal generators, the D/A conversion processes executed by the two D/A converters 11a and 11b, and the receiving processes executed by the two receivers are synchronized with each other. With this arrangement, it is possible to evaluate the MIMO transmission characteristics by simultaneously radiating the modulation wave signals orthognal to each other with using the transmitter circuits 30a and 30b, and simultaneously receiving the multiple waves by the two receiving antennas 60a and 60b, as compared with the fourth preferred embodiment and the modified preferred embodiment thereof.

In addition, in the fourth preferred embodiment and the modified preferred embodiment thereof, the scatterer antenna 50c-n is provided so that the feeding point of the scatterer antenna 50c-n is positioned away from the feeding point of the scatterer antenna 50a-n by a distance λ/2 in a direction from the origin to the feeding point of the scatterer antenna 50a-n, however, the present invention is not limited to this. The scatterer antenna 50c-n may be provided so that the feeding point of the scatterer antenna 50c-n is positioned away from the feeding point of the scatterer antenna 50a-n by a distance λ/2 in a direction from the feeding point of the scatterer antenna 50a-n toward the origin.

In addition, in the third and fourth preferred embodiments and the modified preferred embodiments thereof, it is acceptable to provide a divider for dividing the transmitting signal S22a generated by the signal generator 22a into fourteen transmitting signals and outputting the fourteen transmitting signals to the phase shifters 13a-1 to 13a-7 and 13b-1 to 13b-7, respectively, instead of the dividers 40, 12a and 12b.

Further, in the above-described preferred embodiments and the modified preferred embodiments thereof, the scatterer antennas 50a-1 to 50a-7, 50b-1 to 50b-7, 50c-1 and 50c-7 are provided on the circumference of the circle at equal spaces, however, the present invention is not limited to this. It is proper to place a plurality of two or more scatterer antennas at the periphery of the receiving antenna to be evaluated.

Still further, in the above-described preferred embodiments and the modified preferred embodiments thereof, the signal generator 22a generates the transmitting signal S22a of the unmodulated continuous wave signal, and however, the present invention is not limited to this. It is the signal generator 22a may generate a modulated wave signal.

In addition, in the above-described preferred embodiments and the modified preferred embodiments thereof, the computer 10 controls the trigger generator circuit 70 to transmit the trigger signal S70 to the signal generator 22a and the receivers 21a and 21b in the processing operation, in response to the waveform generation termination notify signals from the D/A converters 11a and 11b, however, the present invention is not limited to this. The computer 10 may control the trigger generator circuit 70 to transmit the trigger signal S70 to the D/A converters 11a and 11b, the signal generator 22a and the receivers 21a and 21b, at least after the measurement time interval Tm has elapsed from the timing when the computer 10 controls the trigger generator circuit 70 to transmit the trigger signal S70 to the D/A converters 11a and 11b, the signal generator 22a and the receivers 21a and 21b, which are put in the trigger wait state. Further, in response to the multiple wave generation termination notify signal from the D/A converter 11a, the computer 10 may stop the operations of the signal generator 22a and the receiver 21a, respectively, without outputting the trigger generation request signal S10t.

Still further, in the above-described preferred embodiments and the modified preferred embodiments thereof, each of the transmitter circuits 30a and 30b divides the inputted transmitting signal into seven transmitting signals, and changes the phase and the amplitude of each of the divided transmitting signals, however, the present invention is not limited to this. Each of the transmitter circuits 30a and 30b may divide the inputted transmitting signal into seven transmitting signals, and change at least one of the phase and the amplitude of each of the divided transmitting signals.

In addition, in the antenna evaluating apparatus having at least one signal generator 22a, at least one transmitter circuit 30a, at least one receiver 21a, the computer 10 and the trigger generator circuit 70, the computer 10 have to execute control as follows. When evaluating the receiving antenna, the computer 10 have to (a) select at least one signal generator as evaluation means used for an evaluation from at least one signal generator 22a, (b) select at least one transmitter circuit as evaluation means used for an evaluation from at least one transmitter circuit 30a, (c) select at least one receiver as evaluation means used for an evaluation from at least one receiver 21a, and control the operation of the trigger generator circuit 70 so as to substantially simultaneously start the respective operations of the selected evaluation means. Further, the computer 10 have to control the operation of the trigger generator circuit 70 so as to substantially simultaneously stop the respective operations of the signal generator and the receiver excluding the transmitter circuit among the selected evaluation means.

Further, in the antenna evaluating apparatus having at least one signal generator 22a, at least one transmitter circuit 30a, at least one receiver 21a and the computer 10A, the computer 10A have to execute control as follows. When evaluating the receiving antenna, the computer 10A have to (a) select at least one signal generator as evaluation means used for an evaluation from at least one signal generator 22a, (b) select at least one transmitter circuit as evaluation means used for an evaluation from at least one transmitter circuit 30a, (c) select at least one receiver as evaluation means used for an evaluation from at least one receiver 21a, and control the operation of the trigger generator circuit 70 so as to substantially simultaneously start the respective operations of the selected evaluation means. Further, the computer 10 have to control the operation of the trigger generator circuit 70 so as to substantially simultaneously stop the respective operations of the signal generator and the receiver excluding the transmitter circuit among the selected evaluation means.

INDUSTRIAL APPLICABILITY

As described above in detail, according to the antenna evaluating apparatus and method of the present invention, the operations of the evaluator means including the signal generator means, the transmitter means and the receiver means used for evaluating the performance of a receiving antenna are substantially simultaneously started, and the performance of the receiving antenna is evaluated based on the received multiple wave. Therefore, it is possible to generate a multiple wave with higher reproducibility at the installation position of the receiving antenna, and to execute the evaluation of the receiving antenna in a time shorter than that of the prior art with an accuracy higher than that of the prior art.

REFERENCE SIGNS LIST 10 and 10A . . . computer,
11$a$ and 11$b$ . . . D/A converter,
12$a$ and 12$b$ . . . divider,
13$a$ and 13$b$ . . . phase shifter circuit,
13$a$-1 to 13$a$-7 and 13$b$-1 to 13$b$-7 . . . phase shifter,
14$a$ and 14$b$ . . . attenuator circuit,
14$a$-1 to 14$a$-7 and 14$b$-1 to 14$b$-7 . . . attenuator,
20$a$ and 20$b$ . . . network analyzer,
21$a$ and 21$b$ . . . receiver,
22$a$ . . . signal generator,
30$a$ and 30$b$ . . . transmitter circuit,
40 . . . divider,
50$a$-1 to 50$a$-7, 50$b$-1 to 50$b$-7 and 50$c$-1 to 50$c$-7 . . . scatterer antenna,
60$a$ and 60$b$ . . . receiving antenna,
70 . . . trigger generator circuit,
80A, 80B, 80C and 80D . . . evaluation circuit,
101 . . . scatterer antenna support base,
102 and 102A . . . receiving antenna support base,
150 . . . portable telephone, and
200A, 200B, 200C, 200D, 200E, 200F, 200G and 200H . . . multiple wave controlling and measuring apparatus.

The invention claimed is:

1. An antenna evaluating apparatus comprising:
a plurality of N scatterer antennas provided at predetermined positions different from each other, respectively;
a signal generator for generating a predetermined transmitting signal;
a transmitter for dividing the transmitting signal into a plurality of N transmitting signals, changing at least one of a phase and an amplitude of each of divided transmitting signals, and radiating changed transmitting signals as radio waves from the scatterer antennas corresponding to the changed transmitting signals, respectively;
a receiver for receiving a multiple wave of radiated radio waves by using a receiving antenna to be evaluated and placed substantially at a center of the respective positions; and
a controller for performing substantially simultaneous starting operations of an evaluation circuit including the signal generator, the transmitter and the receiver, and evaluating a performance of the receiving antenna based on a received multiple wave,
wherein the controller performs substantially simultaneous stopping operations of the signal generator and the receiver excluding the transmitter.

2. The antenna evaluating apparatus as claimed in claim 1, further comprising:
a trigger generator for generating a trigger signal in response to a trigger generation request signal from the controller, and outputting the trigger signal to the evaluation circuit,
wherein the controller generates the trigger generation request signal, and outputs the trigger generation request signal to the trigger generator, and
wherein the evaluation circuit performs substantially simultaneous starting of respective operations in response to the trigger signal.

3. The antenna evaluating apparatus as claimed in claim 1, wherein the controller further comprises a trigger generator for generating a trigger signal, and outputting the trigger signal to the evaluation circuit, and
wherein the evaluation circuit performs substantially simultaneous starting of respective operations in response to the trigger signal.

4. An antenna evaluating apparatus comprising:
a plurality of N scatterer antennas provided at predetermined positions different from each other, respectively;
a signal generator for generating a predetermined transmitting signal;
a transmitter for dividing the transmitting signal into a plurality of N transmitting signals, changing at least one of a phase and an amplitude of each of divided transmitting signals, and radiating changed transmitting signals as radio waves from the scatterer antennas corresponding to the changed transmitting signals, respectively;
a receiver for receiving a multiple wave of radiated radio waves by using a receiving antenna to be evaluated and placed substantially at a center of the respective positions;
at least one signal generator;
at least one transmitter;
at least one receiver; and
a controller for evaluating a performance of the receiving antenna based on a received multiple wave,
wherein, when evaluating the receiving antenna, the controller
(a) from the at least one signal generator, selects at least one signal generator as an evaluation circuit used for an evaluation,
(b) from the at least one transmitter, selects at least one transmitter as an evaluation circuit used for the evaluation,
(c) from the at least one receiver, selects at least one receiver as an evaluation circuit used for the evaluation, and
performs substantially simultaneous starting operations of selected evaluation circuits, and
wherein the controller performs substantially simultaneous stopping operations of the signal generator and the receiver excluding the transmitter among the selected evaluation circuits.

5. The antenna evaluating apparatus as claimed in claim 4, further comprising:
a trigger generator for generating a trigger signal in response to a trigger generation request signal from the controller, and outputting the trigger signal to the evaluation circuits,
wherein the controller generates the trigger generation request signal, and outputs the trigger generation request signal to the trigger generator, and
wherein the evaluation circuits performs substantially simultaneous starting of respective operations in response to the trigger signal.

6. The antenna evaluating apparatus as claimed in claim 4, wherein the controller further comprises a trigger generator for generating a trigger signal, and outputting the trigger signal to the evaluation circuits, and
wherein the evaluation circuits performs substantially simultaneous starting of respective operations in response to the trigger signal.

7. An antenna evaluating method using an antenna evaluating apparatus, the antenna evaluating apparatus including a plurality of N scatterer antennas provided at predetermined positions different from each other, respectively; a signal generator for generating a predetermined transmitting signal; a transmitter for dividing the transmitting signal into a plurality of N transmitting signals, changing at least one of a phase and an amplitude of each of divided transmitting signals, and radiating changed transmitting signals as radio waves from the scatterer antennas corresponding to the changed transmitting signals, respectively; and a receiver for receiving a multiple wave of radiated radio waves by using a receiving antenna to be evaluated and placed substantially at a center of the respective positions, the antenna evaluating method, comprising:

- a control step of performing substantially simultaneous starting operations of an evaluation circuit including the signal generator, the transmitter and the receiver; and
- an evaluating step of evaluating a performance of the receiving antenna based on a received multiple wave,
- wherein the control step further includes a step of performing substantially simultaneous stopping operations of the signal generator and the receiver excluding the transmitter.

8. The antenna evaluating method as claimed in claim 7,
- wherein the antenna evaluation apparatus further comprises a trigger generator for generating a trigger signal in response to a trigger generation request signal, and outputting the trigger signal to the evaluation circuit,
- wherein the control step further includes a step of generating the trigger generation request signal, and outputting the trigger generation request signal to the trigger generator, and
- wherein the evaluation circuit performs substantially simultaneous starting of respective operations in response to the trigger signal.

9. The antenna evaluating method as claimed in claim 7,
- wherein the control step further includes a step of generating a trigger signal, and outputting the trigger signal to the evaluation circuit, and
- wherein the evaluation circuit performs substantially simultaneous starting of respective operations in response to the trigger signal.

10. An antenna evaluating method using an antenna evaluating apparatus, the antenna evaluating apparatus including a plurality of N scatterer antennas provided at predetermined positions different from each other, respectively; a signal generator for generating a predetermined transmitting signal; a transmitter for dividing the transmitting signal into a plurality of N transmitting signals, changing at least one of a phase and an amplitude of each of divided transmitting signals, and radiating changed transmitting signals as radio waves from the scatterer antennas corresponding to the changed transmitting signals, respectively; and a receiver for receiving a multiple wave of radiated radio waves by using a receiving antenna to be evaluated and placed substantially at a center of the respective positions, wherein the antenna evaluating apparatus comprises at least one signal generator, at least one transmitter, and at least one receiver, the antenna evaluating method comprising:

- a control step of evaluating a performance of the receiving antenna based on a received multiple wave,
- wherein, when evaluating the receiving antenna, the control step further includes a step of:
  - (a) from the at least one signal generator, selecting at least one signal generator as an evaluation circuit used for an evaluation,
  - (b) from the at least one transmitter, selecting at least one transmitter as an evaluation circuit used for the evaluation,
  - (c) from the at least one receiver, selecting at least one receiver as an evaluation circuit used for the evaluation;
- a step of performing substantially simultaneous starting operations of selected evaluation circuits; and
- a step of performing substantially simultaneous stopping operations of the signal generator and the receiver excluding the transmitter among the selected evaluation circuits.

11. The antenna evaluating method as claimed in claim 10,
- wherein the antenna evaluation apparatus further comprises a trigger generator for generating a trigger signal in response to a trigger generation request signal, and outputting the trigger signal to the evaluation circuits,
- wherein the control step further includes a step of generating the trigger generation request signal, and outputting the trigger generation request signal to the trigger generator, and
- wherein the evaluation circuits performs substantially simultaneous starting of respective operations in response to the trigger signal.

12. The antenna evaluating method as claimed in claim 10,
- wherein the control step further includes a step of generating a trigger signal, and outputting the trigger signal to the evaluation circuits, and
- wherein the evaluation circuits performs substantially simultaneous starting of respective operations in response to the trigger signal.

* * * * *